United States Patent
Lee et al.

(10) Patent No.: US 11,036,325 B2
(45) Date of Patent: Jun. 15, 2021

(54) TOUCH DISPLAY DEVICE

(71) Applicant: LG Display Co., Ltd., Seoul (KR)

(72) Inventors: Yangsik Lee, Paju-si (KR); HwiDeuk Lee, Paju-si (KR); Jungho Jo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/928,763

(22) Filed: Jul. 14, 2020

(65) Prior Publication Data
US 2021/0064172 A1 Mar. 4, 2021

(30) Foreign Application Priority Data
Aug. 30, 2019 (KR) .......................... 10-2019-0107243

(51) Int. Cl.
| G06F 3/041 | (2006.01) |
| G06F 3/044 | (2006.01) |
| H01L 27/32 | (2006.01) |
| H01L 51/52 | (2006.01) |

(52) U.S. Cl.
CPC .......... *G06F 3/0412* (2013.01); *G06F 3/0446* (2019.05); *H01L 27/323* (2013.01); *H01L 27/3276* (2013.01); *H01L 51/5237* (2013.01); *G06F 2203/04107* (2013.01)

(58) Field of Classification Search
None
See application file for complete search history.

(56) References Cited

U.S. PATENT DOCUMENTS

| 2012/0081328 A1* | 4/2012 | Kandziora ............ G06F 3/0445 345/174 |
| 2014/0332769 A1 | 11/2014 | Lee et al. |
| 2015/0042598 A1* | 2/2015 | Chae .................... G06F 3/0446 345/174 |
| 2016/0154499 A1* | 6/2016 | Bae ..................... G06F 3/04166 345/174 |
| 2018/0095571 A1* | 4/2018 | Park .................... H01L 51/5203 |
| 2018/0203555 A1 | 7/2018 | Miyamoto |
| 2019/0079623 A1 | 3/2019 | Kim et al. |

FOREIGN PATENT DOCUMENTS

EP 3522229 A1 8/2019

OTHER PUBLICATIONS

Extended European Search Report, European Patent Office Application No. EP20190075.0, dated Nov. 9, 2020, ten pages.

* cited by examiner

*Primary Examiner* — Duane N Taylor, Jr.
(74) *Attorney, Agent, or Firm* — Fenwick & West LLP

(57) ABSTRACT

Provided is a touch display device. Because a shielding electrode, which is disposed in a non-active area and electrically coupled between a common electrode and a common voltage supply line, is located between a touch routing line and a signal line, the effects of noise caused by the signal line on the touch routing line may be reduced. Further, an encapsulation portion located on the shielding electrode has a planarized structure. The resulting maintenance of a certain distance between the shielding electrode and the touch routing line may reduce noise caused by the signal line from indirectly affecting the touch routing line through the shielding electrode.

11 Claims, 20 Drawing Sheets

TOUCH DISPLAY DEVICE

CROSS REFERENCE TO RELATED APPLICATION

This application claims priority from Republic of Korea Patent Application No. 10-2019-0107243, filed on Aug. 30, 2019, which is hereby incorporated by reference in its entirety.

BACKGROUND

Field

Embodiments of the present disclosure relate to a touch display device.

Description of Related Art

Along with the development of the information society, demands for display devices that display images are growing. In this regard, various types of display devices, such as liquid crystal display (LCD) devices and organic light emitting diode (OLED) display devices, have been widely used.

To provide more diverse functions to users, these display devices provide a function of recognizing a user's touch on a display panel and processing an input based on the recognized touch.

For example, a display device capable of touch recognition includes a plurality of touch electrodes disposed or built in a display panel, and may detect the presence or absence of a user's touch and, if any, touched coordinates on the display panel by driving the touch electrodes.

As the display panel provides a touch sensing function, while displaying an image, a line for display driving and a line for touch sensing may be arranged in the display panel. In some cases, the line for display driving and the line for touch sensing may overlap with each other or may be arranged close to each other. Therefore, parasitic capacitance between the two lines may degrade the performance of touch sensing.

SUMMARY

Embodiments of the present disclosure provide a method of reducing noise of a touch sensing signal, caused by parasitic capacitance between a line for display driving and a line for touch sensing in a non-active area of a display panel.

According to an aspect, embodiments of the present disclosure provide a touch display device including an active area in which a plurality of light emitting elements are disposed, a non-active area defined outside the active area, in which a plurality of signal lines are disposed, an encapsulation portion disposed in the active area and the non-active area and located on the light emitting elements and the signal lines, a plurality of touch electrodes disposed in the active area on the encapsulation portion, a plurality of touch routing lines disposed in the non-active area on the encapsulation portion and electrically coupled to the touch electrodes, a shielding electrode located under the encapsulation portion in the non-active area, with at least a part thereof located on the signal lines, and electrically coupled to a common electrode of the light emitting elements, and a common voltage supply line located under the shielding electrode and electrically coupled to the shielding electrode. At least one of the shielding electrode or the common voltage supply line is disposed in an area including an area in which the touch routing lines overlap with the signal lines in the non-active area.

At least one of the shielding electrode or the common voltage supply line may be disposed in an area including an area in which the touch routing lines overlap with the signal lines in the non-active area.

According to another aspect, embodiments of the present disclosure provide a touch display device including an active area in which a plurality of light emitting elements are disposed, a non-active area defined outside the active area, in which a plurality of signal lines are disposed, an encapsulation portion disposed in the active area and the non-active area and located on the light emitting elements and the signal lines, a plurality of touch electrodes disposed in the active area on the encapsulation portion, a plurality of touch routing lines disposed in the non-active area on the encapsulation portion and electrically coupled to the touch electrodes, a first shielding electrode located under the encapsulation portion in the non-active area, with at least a part thereof located on the signal lines, and electrically coupled to a common electrode of the light emitting elements, and a second shielding electrode located outside the first shielding electrode in the non-active area and separated from the first shielding electrode.

According to embodiments of the present disclosure, an electrode or line, which is disposed in a non-active area of a display panel and supplies a common voltage to a common electrode of light emitting elements disposed in an active area of the display panel, is positioned between a signal line for display driving and a touch routing line, thereby blocking noise caused by the signal line for display driving.

According to embodiments of the present disclosure, a touch routing line, which is positioned in an area free of a shielding electrode in a non-active area of a display panel, is disposed without overlapping with a signal line for display driving. Therefore, noise of a touch sensing signal may be reduced, which is caused by the signal line for display driving in an area between the shielding electrode and a pad portion.

BRIEF DESCRIPTION OF DRAWINGS

The above and other objects, features, and advantages of the present disclosure will be more clearly understood from the following detailed description, taken in conjunction with the accompanying drawings, in which.

DETAILED DESCRIPTION

Figure 1:
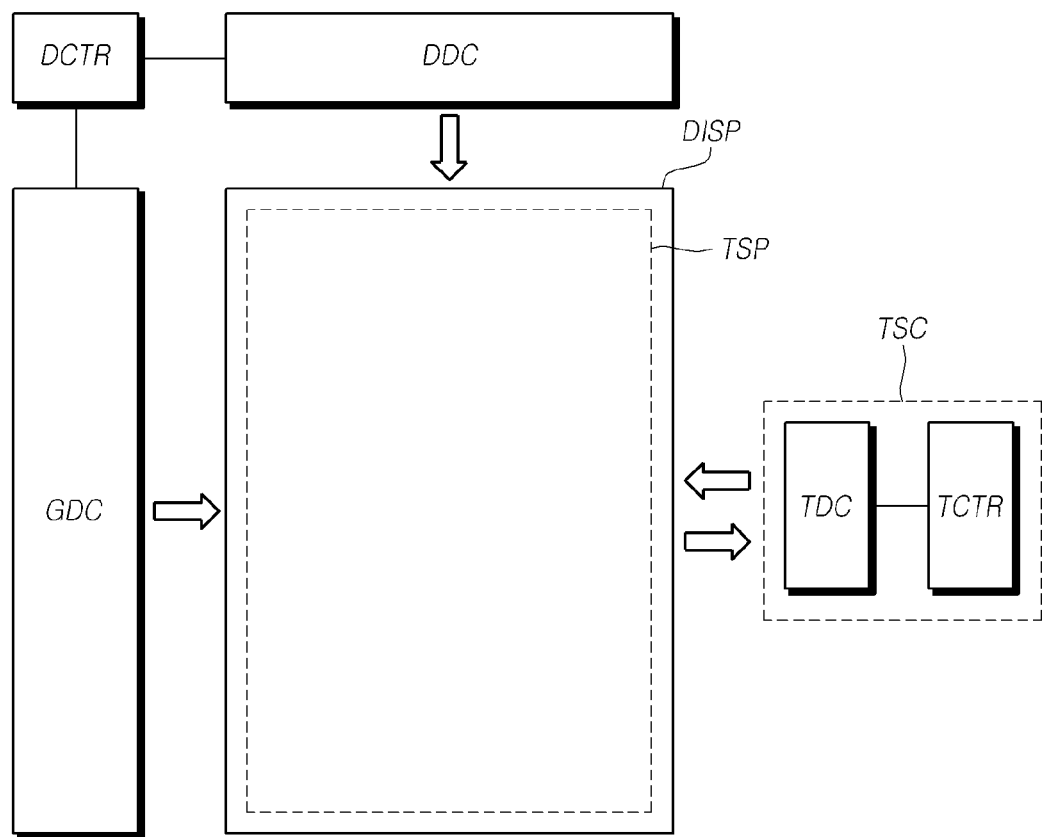
FIG. 1 is a schematic diagram illustrating the configuration of a touch display device according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting", "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after", "subsequent to", "next", "before", and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a diagram illustrating the system configuration of a touch display device according to embodiments of the present disclosure.

Referring to FIG. 1, the touch display device according to the embodiments of the present disclosure may provide both an image display function and a touch sensing function.

To provide the image display function, the touch display device according to the embodiments of the present disclosure may include a display panel DISP in which a plurality of data lines and a plurality of gate lines are disposed, and a plurality of subpixels defined by the plurality of data lines and the plurality of gate lines are arranged, a data driving circuit DDC driving the plurality of data lines, a gate driving circuit GDC driving the plurality of gate lines, and a display controller DCTR controlling operations of the data driving circuit DDC and the gate driving circuit GDC.

Each of the data driving circuit DDC, the gate driving circuit GDC, and the display controller DCTR may be implemented in one or more individual parts. In some cases, two or more of the data driving circuit DDC, the gate driving circuit GDC, and the display controller DCTR may be integrated into one part. For example, the data driving circuit DDC and the display controller DCTR may be implemented into one integrated circuit (IC) chip.

To provide the touch sensing function, the touch display device according to the embodiments of the present disclosure may include a touch panel TSP including a plurality of touch electrodes, and a touch sensing circuit TSC supplying a touch driving signal to the touch panel TSP, detecting a touch sensing signal from the touch panel TSP, and sensing the presence or absence of a user's touch on the touch panel TSP or a touched position (touched coordinates) based on the detected touch sensing signal.

The touch sensing circuit TSC may include, for example, a touch driving circuit TDC supplying the touch driving signal to the touch panel TSP and detecting the touch sensing signal from the touch panel TSP, and a touch controller TCTR sensing the presence or absence of a user's touch on the touch panel TSP or a touched position (touched coordinates) based on the touch sensing signal detected by the touch driving circuit TDC.

The touch driving circuit TDC may include a first circuit part supplying the touch driving signal to the touch panel TSP and a second circuit part detecting the touch sensing signal from the touch panel TSP.

The touch driving circuit TDC and the touch controller TCTR may be implemented as separate parts, or integrated into one part, when needed.

Each of the data driving circuit DDC, the gate driving circuit GDC, and the touch driving circuit TDC may be implemented as one or more ICs, and configured as a chip on glass (COG) type, a chip on film (COF) type, or a tape carrier package (TCP) type from the perspective of electrical connection to the display panel DISP. The gate driving circuit GDC may also be configured as a gate in panel (GIP) type.

Each of the circuit components DDC, GDC, and DCTR for display driving and the circuit components TDC and TCTR for touch sensing may be implemented as one or more individual parts. In some cases, one or more of the circuit components DDC, GDC, and DCTR for display driving and one or more of the circuit components TDC and TCTR for touch sensing may functionally be integrated and thus implemented as one or more parts.

For example, the data driving circuit DDC and the touch driving circuit TDC may be integrated into one or more IC chips. When the data driving circuit DDC and the touch driving circuit TDC are integrated into two or more IC chips, the IC chips may have a data driving function and a touch driving function, respectively.

The touch display device according to embodiments of the present disclosure may be any of various types such as an OLED device and an LCD device. For the convenience of description, the following description is given in the context of the touch display device being an OLED device, by way of example. That is, although the display panel DISP may be any of various types such as an OLED panel and an LCD panel, an OLED panel is taken below as an example of the display panel DISP, for the convenience of description.

Further, the touch panel TSP may include a plurality of touch electrodes to which the touch driving signal may be applied or from which the touch sensing signal may be detected, and a plurality of touch routing lines that couple the touch electrodes to the touch driving circuit TDC.

The touch panel TSP may be located outside the display panel DISP. That is, the touch panel TSP and the display panel DISP may be separately fabricated and then combined. This touch panel TSP is referred to as an external type or an add-on type.

In contrast, the touch panel TSP may be built in the display panel DISP. That is, when the display panel DISP is fabricated, a touch sensor structure including the plurality of touch electrodes and the plurality of touch routing lines of the touch panel TSP may be formed together with electrodes and signal lines for display driving. This touch panel TSP is referred to as an internal type. For the convenience of description, the touch panel TSP will be described as an internal type, by way of example.

Figure 2:
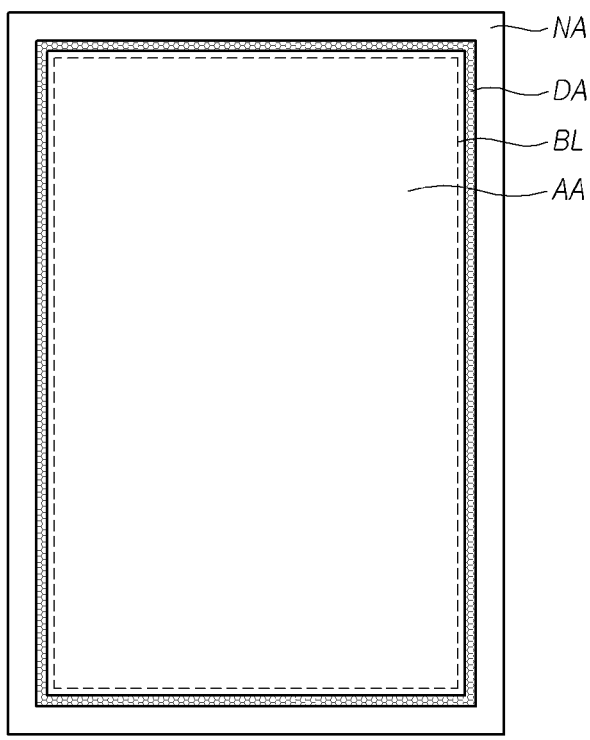
FIG. 2 is a schematic diagram illustrating a display panel in the touch display device according to embodiments of the present disclosure.

FIG. 2 is a diagram schematically illustrating the display panel DISP in the touch display device according to embodiments of the present disclosure.

Referring to FIG. 2, the display panel DISP may include an active area AA in which an image is displayed and a non-active area NA defined outside an outer boundary line BL of the active area AA.

A plurality of subpixels may be arranged and electrodes and signal lines for display driving may be disposed in the active area AA of the display panel DISP.

Further, a plurality of touch electrodes for touch sensing and a plurality of touch routing lines electrically coupled to the touch electrodes may be disposed in the active area AA of the display panel DISP. Accordingly, the active area AA may also be referred to as a touch sensing area in which touch sensing is possible.

Link lines extended from or electrically coupled to the signal lines disposed in the active area AA and pads electrically coupled to the link lines may be disposed in the non-active area NA of the display panel DISP. The pads disposed in the non-active area NA may be bonded or electrically coupled to the display driving circuits DDC, GDC, and so on.

Link lines extended from or electrically coupled to the touch routing lines disposed in the active area AA and pads electrically coupled to link lines may be disposed in the non-active area NA of the display panel DISP. The pads disposed in the non-active area NA may be bonded or electrically coupled to the touch driving circuit TDC.

In the non-active area NA, extensions of parts of outermost touch electrodes among the plurality of touch electrodes disposed in the active area AA may exist, or one or more electrodes (touch electrodes) formed of the same material as the plurality of touch electrodes disposed in the active area AA may further be disposed.

That is, all of the plurality of touch electrodes disposed in the display panel DISP may exist within the active area AA, a part (e.g., the outermost touch electrodes) of the plurality of touch electrodes disposed in the display panel DISP may exist in the non-active area NA, or a part (e.g., the outermost touch electrode) of the plurality of touch electrodes disposed in the display panel DISP may exist across the active area AA and the non-active area NA.

Referring to FIG. 2, the display panel DISP of the touch display device according to embodiments of the present disclosure may include a dam area DA in which a dam DAM is disposed to reduce the possibility of collapse of any layer (e.g., an encapsulation portion in the OLED panel) in the active area AA.

The dam area DA may be located at a boundary point between the active area AA and the non-active area NA or at a point in the non-active area NA outside the active area AA.

The dam DAM disposed in the dam area DA may surround the active area AA in all directions or may be disposed outside only one or more portions (e.g., one or more portions having a fragile layer) of the active area AA.

The dam DAM disposed in the dam area DA may be a single interconnected pattern or two or more disconnected patterns. Further, only a primary dam, two dams (the primary dam and a secondary dam), or three or more dams may be disposed in the dam area DA.

In the dam area DA, there may be only the primary dam in one direction, and both the primary dam and the secondary dam in another direction.

Figure 3:
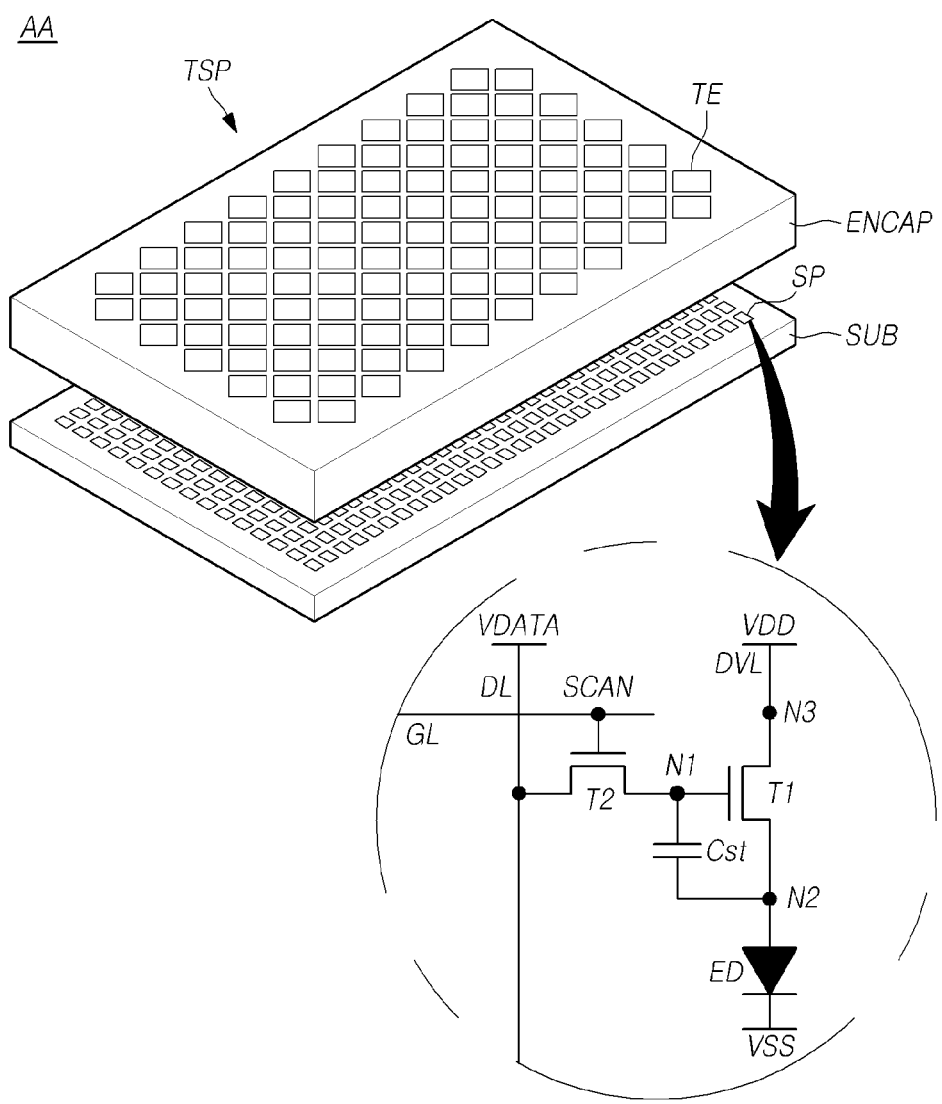
FIG. 3 is a diagram illustrating an exemplary built-in structure of a touch panel in the display panel according to embodiments of the present disclosure.

FIG. 3 is a diagram illustrating an exemplary built-in structure of touch panel TSP in the display panel DISP according to embodiments of the present disclosure.

Referring to FIG. 3, a plurality of subpixels SP may be arranged on a substrate SUB in the active area AA of the display panel DISP.

Each sub-pixel SP may include a light emitting element ED, a first transistor T1 driving the light emitting element ED, a second transistor T2 transmitting a data voltage VDATA to a first node N1 of the first transistor T1, and a storage capacitor Cst maintaining a constant voltage for the duration of one frame.

The first transistor T1 may include the first node N1 to which the data voltage VDATA may be applied, a second node N2 electrically coupled to the light emitting element ED, and a third node N3 to which a driving voltage VDD is applied from a driving voltage line DVL. The first node N1 may be a gate node, the second node N2 may be a source node or a drain node, and the third node N3 may be the drain node or the source node. The first transistor T1 is also referred to as a driving transistor driving the light emitting element ED.

The light emitting element ED may include a first electrode (e.g., an anode electrode), a light emitting layer, and a second electrode (e.g., a cathode electrode). The first electrode may be electrically coupled to the second node N2 of the first transistor T1, and a base voltage VSS may be applied to the second electrode.

In the light emitting element ED, the light emitting layer may be an organic light emitting layer containing an organic material. In this case, the light emitting element ED may be an OLED.

On and off of the second transistor T2 may be controlled by a scan signal SCAN applied through a gate line GL, and coupled between the first node N1 of the first transistor T1 and a data line DL. The second transistor T2 is also referred to as a switching transistor.

When the second transistor T2 is turned on by the scan signal SCAN, the data voltage VDATA supplied from the data line DL is transferred to the first node N1 of the first transistor T1.

The storage capacitor Cst may be electrically coupled between the first node N1 and the second node N2 of the first transistor T1.

Each subpixel SP may have a 2T1C structure including two transistors T1 and T2 and one capacitor Cst, as illustrated in FIG. 3. In some cases, the subpixel SP may further include one or more transistors or one or more capacitors.

The storage capacitor Cst may be not a parasitic capacitor (e.g., Cgs or Cgd) which is an internal capacitor between the first node N1 and the second node N2 of the first transistor T1, but an external capacitor intentionally designed to be outside the first transistor T1.

Each of the first transistor T1 and the second transistor T2 may be an n-type transistor or a p-type transistor.

As described before, circuit elements such as a light emitting element ED, two or more transistors T1 and T2, and one or more capacitors Cst are disposed on the display panel DISP. Since these circuit elements (especially, the light emitting element ED) are vulnerable to external moisture or oxygen, an encapsulation portion ENCAP may be disposed on the display panel DISP to reduce external moisture or oxygen from penetrating into the circuit elements (especially, the light emitting element ED).

The encapsulation portion ENCAP may have a single layer or multiple layers.

In the touch display device according to embodiments of the present disclosure, the touch panel TSP may be formed on the encapsulation portion ENCAP.

That is, the touch sensor structure with the plurality of touch electrodes 1E, in the touch panel TSP may be disposed on the encapsulation ENCAP in the touch display device.

During touch sensing, the touch driving signal or the touch sensing signal may be applied to the touch electrodes TE. Therefore, an electric potential difference may be generated between the touch electrodes TE and the cathode electrodes disposed with the encapsulation portion ENCAP in between, thereby generating unnecessary parasitic capacitance during touch sensing. Since the parasitic capacitance may degrade touch sensitivity, the distance between the touch electrodes 1 and the cathode electrodes may be set to a predetermined value (e.g., 1 um) or more in consideration of a panel thickness, a panel manufacturing process, and display performance in order to reduce the parasitic capacitance. For this purpose, the thickness of the encapsulation portion ENCAP may be set to at least 1 μm.

Figure 4:
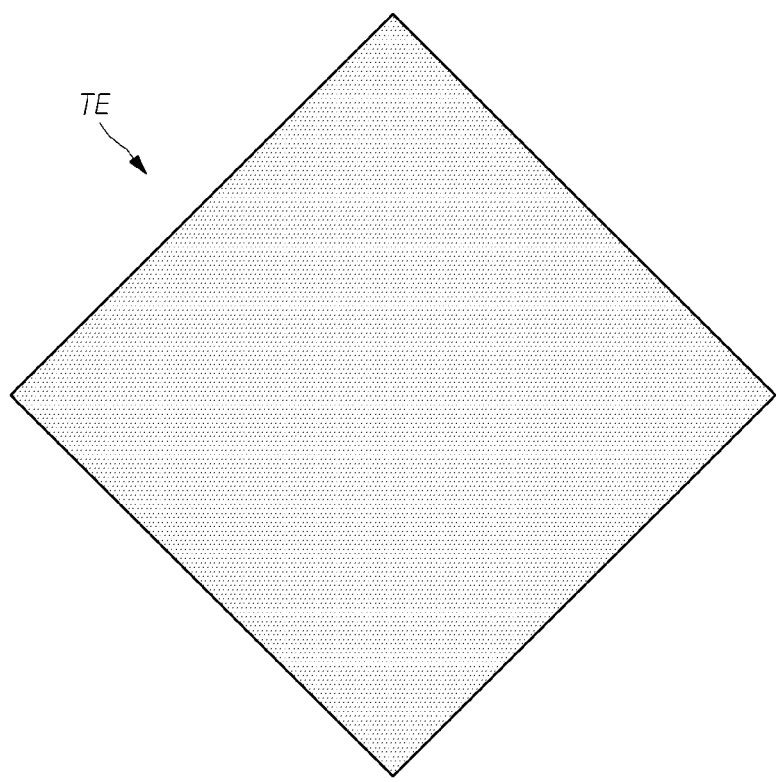
FIGS. 4 and 5 are diagrams illustrating exemplary types of touch electrodes arranged in the display panel according to embodiments of the present disclosure.
Figure 5:
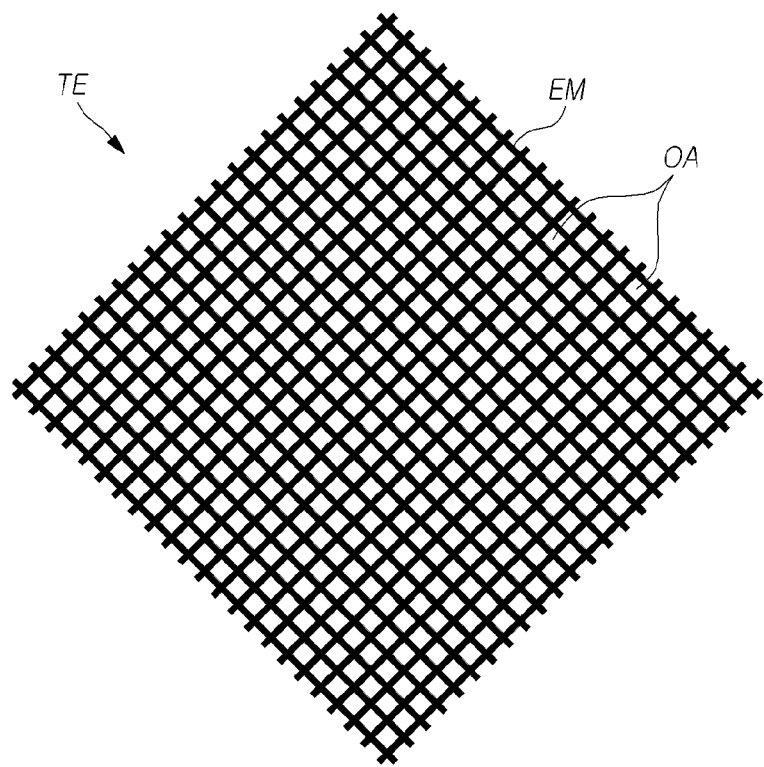

FIGS. 4 and 5 are diagrams illustrating exemplary types of the touch electrodes 1 disposed on the display panel DISP according to embodiments of the present disclosure.

As illustrated in FIG. 4, each touch electrode TE disposed on the display panel DISP may be a plate-shaped electrode metal without an opening. In this case, each touch electrode TE may be a transparent electrode. That is, each touch electrode TE may be formed of a transparent electrode material so that light emitted from a plurality of underlying subpixels SP may be transmitted upward.

In contrast, as illustrated in FIG. 5, each touch electrode TE disposed on the display panel DISP may be an electrode metal EM with two or more openings OA through patterning into a mesh type.

The electrode metal EM corresponds to a substantial touch electrode TE, to which the touch driving signal is applied or in which the touch sensing signal is sensed.

As illustrated in FIG. 5, when each touch electrode TE, is an electrode metal EM patterned into a mesh type, two or more openings OA may exist in the area of the touch electrode TE.

Each of the two or more openings OA in each touch electrode 1 may correspond to light emitting areas of one or more subpixels SP. That is, the plurality of openings OA are paths through which light emitted from a plurality of underlying subpixels SP pass upward. The following description is given with the appreciation that each touch electrode TE is a mesh-type electrode metal EM, by way of example for the convenience of description.

The electrode metal EM corresponding to each touch electrode TE may be located on a bank disposed in an area other than the light emitting areas of two or more subpixels SP.

A plurality of touch electrodes TE may be formed by forming a wide electrode metal EM in a mesh type and then cutting the electrode metal EM into predetermined patterns which are electrically separated from each other.

The outline of the touch electrode TE may be shaped into a square such as a diamond or a rhombus, or any other shape such as a triangle, a pentagon, or a hexagon.

Figure 6:
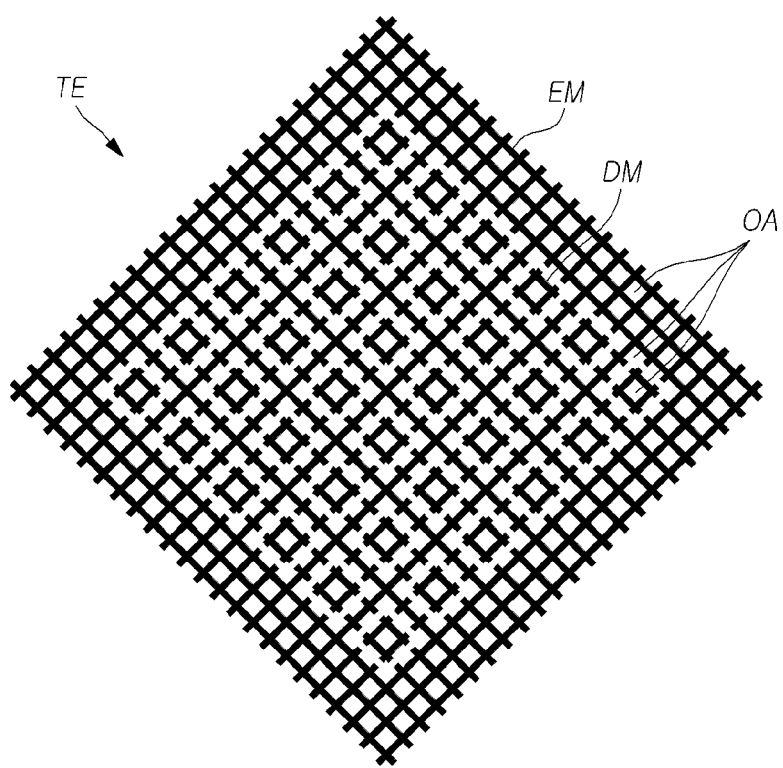
FIG. 6 is a diagram illustrating an exemplary mesh-type touch electrode illustrated in FIG. 5 according to embodiments of the present disclosure.

FIG. 6 is a diagram illustrating an example of the mesh-type touch electrode TE of FIG. 5.

Referring to FIG. 6, there may be one or more dummy metals DM separated from the mesh-type electrode metal EM in the area of each touch electrode TE.

The electrode metal EM is a part corresponding to a substantial touch electrode TE, to which the touch driving signal is applied or in which the touch sensing signal is sensed, whereas the dummy metals DM are present in the area of the touch electrode TE, to which the touch driving signal is not applied and from which the touch sensing signal is not detected. That is, the dummy metals DM may be electrically floated metals.

Therefore, the electrode metal EM may be electrically coupled to the touch driving circuit TDC, whereas the dummy metals DM may not be electrically coupled to the touch driving circuit TDC.

In the area of each touch electrode TE, one or more dummy metals DM may exist, disconnected from the electrode metal EM.

Alternatively, one or more dummy metals DM may exist, disconnected from the electrode metal EM only in the area of each of some touch electrodes 1B. That is, there may be no dummy metal DM in the areas of some touch electrodes TE.

Regarding the role of the dummy metals DM, when only the electrode metal EM exists in a mesh type with no dummy metal DM in the area of a touch electrode TE as illustrated in FIG. 5, the visibility problem that the outline of the electrode metal EM appears on a screen may occur.

In contrast, when one or more dummy metals DM are present in the area of the touch electrode TE as illustrated in FIG. 6, the visibility problem that the outline of the electrode metal EM appears on a screen may be prevented.

Further, the presence or absence of a dummy metal DM or the number of dummy metals DM (a dummy metal ratio) may be adjusted for each touch electrode 1B. The resulting adjustment of the magnitude of the capacitance for each touch electrode TE may lead to improved touch sensitivity.

Some points of the electrode metal EM formed in the area of one touch electrode TE may be cut to produce dummy metals DM. That is, the electrode metal EM and the dummy metals DM may be formed of the same material in the same layer.

The touch display device according to embodiments of the present disclosure may sense a touch based on capacitance generated in the touch electrodes TE.

For touch sensing, the touch display device according to embodiments of the present disclosure may adopt a mutual-capacitance-based touch sensing scheme or a self-capacitance-based touch sensing scheme as a capacitance-based sensing scheme.

In the mutual-capacitance-based touch sensing scheme, a plurality of touch electrodes TE may be divided into driving touch electrodes (transmitting touch electrodes) to which the touch driving signal is applied, and sensing touch electrodes (receiving touch electrodes) in which the touch sensing signal is detected and which generate capacitance along with the driving touch electrodes.

In this mutual-capacitance-based touch sensing scheme, the touch sensing circuit TSC may sense the presence or absence of a touch and/or touched coordinates based on a change in capacitance (mutual capacitance) between a driving touch electrode and a sensing touch electrode according to the presence or absence of a pointer such as a finger or a pen.

In the self-capacitance-based touch sensing scheme, each touch electrode TE may function as both a driving touch electrode and a sensing touch electrode. That is, the touch sensing circuit TSC may apply the touch driving signal to at least one touch electrode 1B, detect a touch sensing signal through the touch electrode TE to which the touch driving signal is applied, and sense the presence or absence of a touch and/or touched coordinates by determining a change in capacitance between a pointer such as a finger or a pen and the touch electrode TE based on the detected touch sensing signal. In the self-capacitance-based touch sensing scheme, there is no distinction between a driving touch electrode and a sensing touch electrode.

As such, the touch display device according to embodiments of the present disclosure may sense a touch in the mutual-capacitance-based touch sensing scheme or the self-capacitance-based touch sensing scheme. However, for the convenience of description, the following description is given with the appreciation that the touch display device performs mutual-capacitance-based touch sensing and has a touch sensor structure for the mutual-capacitance-based touch sensing, by way of example.

Figure 7:
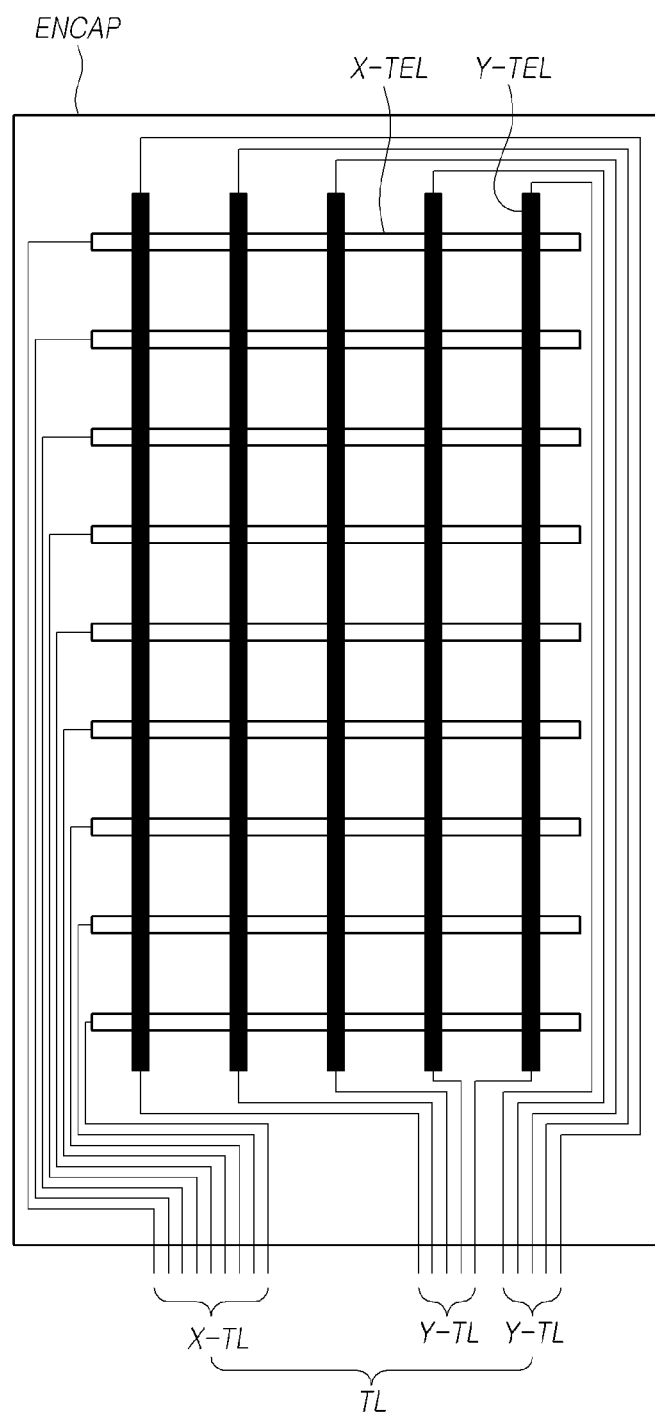
FIG. 7 is a simplified diagram illustrating the structure of a touch sensor in the display panel according to embodiments of the present disclosure.
Figure 8:
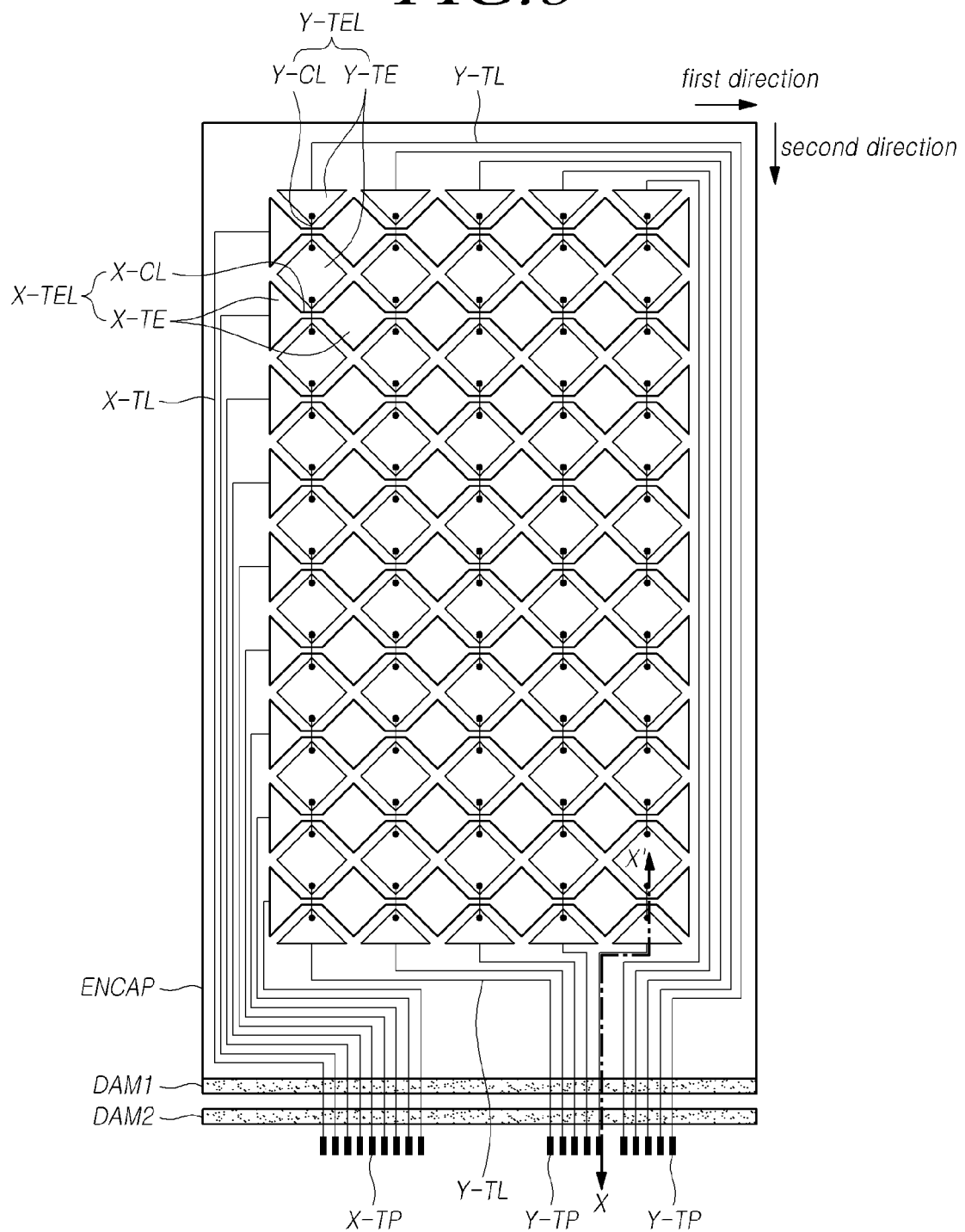
FIG. 8 is a diagram illustrating exemplary implementation of the structure of the touch sensor illustrated in FIG. 7 according to embodiments of the present disclosure.

FIG. 7 is a simplified diagram illustrating the touch sensor structure of the display panel DISP according to embodiments of the present disclosure, and FIG. 8 is a diagram illustrating an implementation example of the touch sensor structure of FIG. 7.

Referring to FIG. 7, a touch sensor structure for mutual-capacitance-based touch sensing may include a plurality of X-touch electrode lines X-TEL and a plurality of Y-touch electrode lines Y-TEL. The plurality of X-touch electrode lines X-TEL and the plurality of Y-touch electrode lines Y-TEL are positioned on the encapsulation portion ENCAP.

The plurality of X-touch electrode lines X-TEL may be arranged in a first direction, and the plurality of Y-touch electrode lines Y-TEL may be arranged in a second direction different from the first direction.

In the present disclosure, the first direction and the second direction may be different relative to each other. For example, the first direction may be an x-axis direction and the second direction may be a y-axis direction. On the contrary, the first direction may be the y-axis direction and the second direction may be the x-axis direction. Further, the first direction and the second direction may or may not be orthogonal to each other. Further, rows and columns are relative to each other, and thus may be exchanged according to a viewing point.

Each of the plurality of X-touch electrode lines X-TEL may include a plurality of X-touch electrodes X-TE electrically coupled to each other. Each of the plurality of Y-touch electrode lines Y-TEL may include a plurality of Y-touch electrodes Y-TE electrically coupled to each other.

The plurality of X-touch electrodes X-TE and the plurality of Y-touch electrodes Y-TE are included in the plurality of touch electrodes TE and are different in roles (functions).

For example, the plurality of X-touch electrodes X-TE in each of the plurality of X-touch electrode lines X-TEL may be driving touch electrodes, and the plurality of Y-touch electrodes Y-TE in each of the plurality of Y-touch electrode lines Y-TEL may be sensing touch electrodes. In this case, each of the plurality of X-touch electrode lines X-TEL corresponds to a driving touch electrode line, and each of the plurality of Y-touch electrode lines Y-TEL corresponds to a sensing touch electrode line.

On the contrary, the plurality of X-touch electrodes X-TE in each of the plurality of X-touch electrode lines X-TEL may be sensing touch electrodes, and the plurality of Y-touch electrodes Y-TE in each of the plurality of Y-touch electrode lines Y-TEL may be driving touch electrodes. In this case, each of the plurality of X-touch electrode lines X-TEL corresponds to a sensing touch electrode line, and each of the plurality of Y-touch electrode lines Y-TEL corresponds to a driving touch electrode line.

A touch sensor metal for touch sensing may include a plurality of touch routing lines TL in addition to the plurality of X-touch electrode lines X-TEL and the plurality of Y-touch electrode lines Y-TEL.

The plurality of touch routing lines TL may include one or more X-touch routing lines X-TL coupled to each of the plurality of X-touch electrode lines X-TEL, and one or more Y-touch routing lines Y-TL coupled to each of the plurality of Y-touch electrode lines Y-TEL.

Referring to FIG. 8, each of the plurality of X-touch electrode lines X-TEL may include a plurality of X-touch electrodes X-TE disposed in the same row (or column) and one or more X-touch electrode connection lines X-CL electrically coupling the plurality of X-touch electrodes X-TE to each other. An X-touch electrode connection line X-CL coupling two adjacent X-touch electrodes X-TE to each other may be a metal integrated with the two adjacent X-touch electrodes X-TE (see FIG. 8) or a metal coupled to the two adjacent X-touch electrodes X-TE through contact holes.

Each of the plurality of Y-touch electrode lines Y-TEL may include a plurality of Y-touch electrodes Y-TE disposed in the same column (or row) and one or more Y-touch electrode connection lines Y-CL electrically coupling the plurality of Y-touch electrodes Y-TE to each other. A Y-touch electrode connection line Y-CL coupling two adjacent Y-touch electrodes Y-TE to each other may be a metal integrated with the two adjacent Y-touch electrodes Y-TE or a metal coupled to the two adjacent Y-touch electrodes Y-TE through contact holes (see FIG. 8).

In this case, the X-touch electrode connection lines X-CL and the Y-touch electrode connection lines Y-CL may intersect in the areas (touch electrode line intersections) where the X-touch electrode lines X-TEL and the Y-touch electrode lines Y-TEL intersect.

When the X-touch electrode connection lines X-CL and the Y-touch electrode connection lines Y-CL intersect in the touch electrode line intersections in this manner, the X-touch electrode connection lines X-CL and the Y-touch electrode connection lines Y-CL should be located in different layers.

Therefore, the plurality of X-touch electrodes X-TE, the plurality of X-touch electrode connection lines X-CL, the plurality of Y-touch electrodes Y-TE, and the plurality of Y-touch electrode connection lines Y-CL may be located in two or more layers, so that the plurality of X-touch electrode lines X-TEL may intersect the plurality of Y-touch electrode lines Y-TEL.

Referring to FIG. 8, each of the plurality of X-touch electrode lines X-TEL is electrically coupled to a corresponding X-touch pad X-TP through one or more X-touch routing lines X-TL. That is, the outermost one of the plurality of X-touch electrodes X-TE included in one X-touch electrode line X-TEL is electrically coupled to a corresponding X-touch pad X-TP.

Each of the plurality of Y-touch electrode lines Y-TEL is electrically coupled to a corresponding Y-touch pad Y-TP through one or more Y-touch routing lines Y-TL. That is, the outermost one of the plurality of Y-touch electrodes Y-TE included in one Y-touch electrode line Y-TEL is electrically coupled to a corresponding Y-touch pad Y-TP.

As illustrated in FIG. 8, the plurality of X-touch electrode lines X-TEL and the plurality of Y-touch electrode lines Y-TEL may be disposed on the encapsulation portion ENCAP. That is, the plurality of X-touch electrodes X-TE and the plurality of X-touch electrode connection lines X-CL included in the plurality of X-touch electrode lines X-TEL may be disposed on the encapsulation portion ENCAP. The plurality of Y-touch electrodes Y-TE and the plurality of Y-touch electrode connection lines Y-CL included in the plurality of Y-touch electrode lines Y-TEL may be disposed on the encapsulation portion ENCAP.

As illustrated in FIG. 8, each of the plurality of X-touch routing lines X-TL electrically coupled to the plurality of X-touch electrode lines X-TEL may be disposed on the encapsulation portion ENCAP and extended even to a place free of the encapsulation portion ENCAP to be electrically coupled to a plurality of X-touch pads X-TP. Each of the plurality of Y-touch routing lines Y-TL electrically coupled to the plurality of Y-touch electrode lines Y-TEL may be disposed on the encapsulation portion ENCAP and extended even to a place free of the encapsulation portion ENCAP to be electrically coupled to a plurality of Y-touch pads Y-TP.

The encapsulation portion ENCAP may be located within the active area AA, and in some cases, may be extended to the non-active area NA.

As described before, the dam area DA may exist in the boundary area between the active area AA and the non-active area or in the non-active area NA outside the active area AA in order to prevent collapse of any layer (e.g., the encapsulation portion in the OLED panel) in the active area AA.

As illustrated in FIG. 8, for example, a primary dam DAM1 and a secondary dam DAM2 may be disposed in the dam area DA. The secondary dam DAM2 may be located more outward than the primary dam DAM1.

Unlike the example of FIG. 8, only the primary dam DAM1 may be located in the dam area DA. In some cases, one or more additional dams as well as the primary dam DAM1 and the secondary dam DAM2 may be disposed in the dam area DA.

Referring to FIG. 8, the encapsulation portion ENCAP may be located on a side surface of the primary dam DAM1, or both side and top surfaces of the primary dam DAM1.

Figure 9:
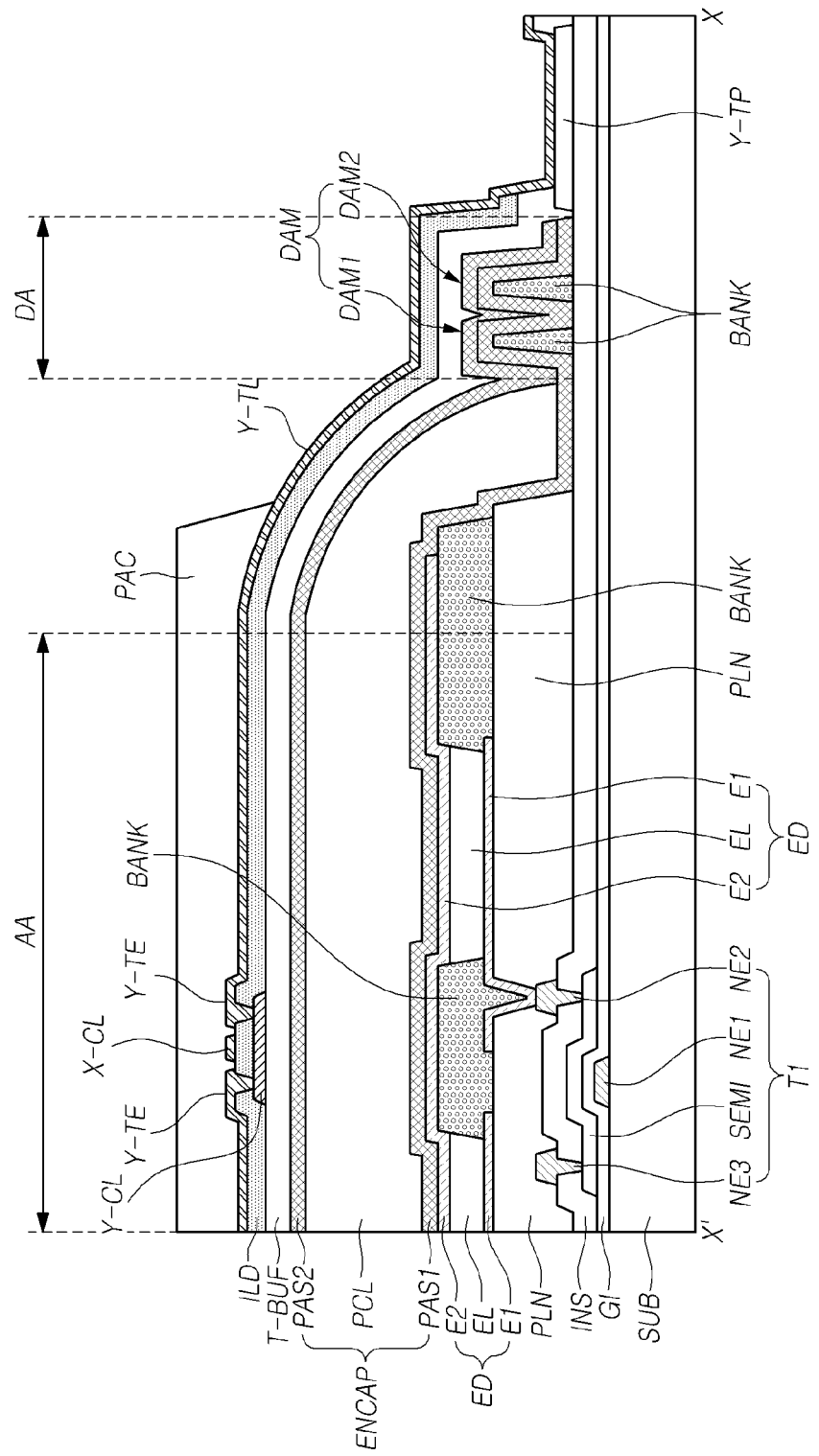
FIG. 9 is a partial sectional view illustrating the display panel, taken along line X-X' illustrated in FIG. 8, according to embodiments of the present disclosure.

FIG. 9 is a partial cross-sectional view of the display panel DISP according to embodiments of the present disclosure, taken along line X-X' illustrated in FIG. 8. While a touch electrode TE is shown as shaped into a plate in FIG. 9, this is merely an example, and the touch electrode TE, may be a mesh type. In addition, when the touch electrode TE, is a mesh type, an opening OA of the touch electrode TE may be positioned on the light emitting area of a subpixel SP.

The driving transistor, that is, the first transistor T1 of each subpixel SP in the active area AA is disposed on the substrate SUB.

The first transistor T1 includes a first node electrode NE1 corresponding to a gate electrode, a second node electrode NE2 corresponding to a source electrode or a drain electrode, a third node electrode NE3 corresponding to the drain electrode or the source electrode, and a semiconductor layer SEMI.

The first node electrode NE1 and the semiconductor layer SEMI may overlap with each other, with a gate insulation layer GI interposed therebetween. The second node electrode NE2 may be formed on an insulation layer INS to contact one side of the semiconductor layer SEMI, and the third node electrode NE3 may be formed on the insulation layer INS to contact the other side of the semiconductor layer SEMI.

A light emitting element ED may include a first electrode E1 corresponding to an anode electrode (or cathode electrode), a light emitting layer EL formed on the first electrode E1, and a second electrode E2 corresponding to a cathode electrode (or anode electrode) formed on the light emitting layer EL.

The first electrode E1 is electrically coupled to the second node electrode NE2 of the first transistor T1, which is exposed through a pixel contact hole penetrating through a planarization layer PLN.

The light emitting layer EL is formed on the first electrode E1 in a light emitting area defined by banks BANK. The light emitting layer EL is formed by stacking a hole-related layer, a light emitting layer, and an electron-related layer in this order or reverse order on the first electrode E1. The second electrode E2 is formed to oppose the first electrode E1, with the light emitting layer EL interposed therebetween.

The encapsulation portion ENCAP blocks penetration of external moisture or oxygen into the light emitting element ED vulnerable to the external moisture or oxygen.

The encapsulation portion ENCAP may be made up of a single layer or a plurality of layers PAS1, PCL, and PAS2 as illustrated in FIG. 9.

For example, when the encapsulation portion ENCAP is made up of the plurality of layers PAS1, PCL, and PAS2, the encapsulation portion ENCAP may include one or more inorganic encapsulation layers PAS1 and PAS2 and one or more organic encapsulation layers PCL. In a specific example, the encapsulation portion ENCAP may be a sequential stack of the first inorganic encapsulation layer PAS1, the organic encapsulation layer PCL, and the second inorganic encapsulation layer PAS2 in this order.

The organic encapsulation layer PCL may further include at least one organic encapsulation layer or at least one inorganic encapsulation layer.

The first inorganic encapsulation layer PAS1 is formed closest to the light emitting element ED on the substrate SUB on which the second electrode E2 corresponding to the cathode electrode is formed. The first inorganic encapsulation layer PAS1 is formed of, for example, an inorganic insulation material allowing low-temperature deposition such as silicon nitride (SiNx), silicon oxide (SiOx), silicon oxynitride (SiON), or aluminum oxide (Al2O3). Since the first inorganic encapsulation layer PAS1 is deposited in a low-temperature atmosphere, the first inorganic encapsulation layer PAS1 may prevent damage to the light emitting layer EL containing an organic material vulnerable to a high temperature atmosphere in the deposition process.

The organic encapsulation layer PCL may be formed over a smaller area than the first inorganic encapsulation layer PAS1. In this case, the organic encapsulation layer PCL may be formed to expose both ends of the first inorganic encapsulation layer PAS1. The organic encapsulation layer PCL may serve as a buffer for alleviating stress between layers, caused by bending of the touch display device, which is an OLED device, and may serve to enhance planarization performance. The organic encapsulation layer PCL may be formed of, for example, an organic insulation material such as acrylic resin, epoxy resin, polyimide, polyethylene, or silicon oxycarbon (SiOC).

When the organic encapsulation layer PCL is formed in an inkjet scheme, one or more dams DAM may be formed in the dam area DA corresponding to a boundary area between the non-active area NA and the active area AA or a partial area of the non-active area NA.

For example, as illustrated in FIG. 9, the dam area DA may be positioned between the active area AA and a pad area in which the plurality of X-touch pads X-TP and the plurality of Y-touch pads Y-TP are formed in the non-active area NA. The primary dam DAM1 adjacent to the active area AA and the secondary dam DAM2 adjacent to the pad area may exist in the dam area DA.

When the organic encapsulation layer PCL in a liquid form is dropped in the active area AA, the one or more dams DAM disposed in the dam area DA may reduce collapsing of the organic encapsulation layer PCL in the liquid in the direction of the non-active area NA and thus invading the pad area.

The presence of the primary dam DAM1 and the secondary dam DAM2 as illustrated in FIG. 9 may enhance this effect.

The primary dam DAM1 and/or the secondary dam DAM2 may be formed in a single-layer or multi-layer structure. For example, the primary dam DAM1 and/or the secondary dam DAM2 may be simultaneously formed of the same material as at least one of a bank BANK or a spacer (not shown). In this case, the dam structure may be formed without an additional mask process and a cost increase.

Further, the primary dam DAM1 and/or the secondary dam DAM2 may be formed in a structure in which the first inorganic encapsulation layer PAS1 and/or the second inorganic encapsulation layer PAS2 is stacked on the banks BANK, as illustrated in FIG. 9.

Further, the organic encapsulation layer PCL containing an organic material may be located only on the inner side surface of the primary dam DAM1 as illustrated in FIG. 9.

Alternatively, the organic encapsulation layer PCL containing the organic material may be located on at least a part of each of the primary dam DAM1 and the secondary dam DAM2. For example, the organic encapsulation layer PCL may be located on top of the primary dam DAM1.

The second inorganic encapsulation layer PAS2 may be formed on the substrate SUB with the organic encapsulation layer PCL formed thereon, to cover the top surface and a side surface of each of the organic encapsulation layer PCL and the first inorganic encapsulation layer PAS1. The second inorganic encapsulation layer PAS2 reduces or blocks penetration of external moisture or oxygen into the first inorganic encapsulation layer PAS1 and the organic encapsulation layer PCL. The second inorganic encapsulation layer PAS2 is formed of, for example, an inorganic insulation material such as silicon nitride (SiNx), silicon oxide (SiOx), silicon oxynitride (SiON), or aluminum oxide ($Al_2O_3$).

A touch buffer film T-BUF may be disposed on the encapsulation portion ENCAP. The touch buffer film T-BUF may be interposed between the touch sensor metal including the X-touch and Y-touch electrodes X-TE, and Y-TE and the X-touch and Y-touch electrode connection lines X-CL and Y-CL and the second electrode E2 of the light emitting element ED.

The touch buffer film T-BUF may be designed such that the distance between the touch sensor metal and the second electrode E2 of the light emitting element ED is maintained to be a predetermined minimum value (e.g., 1 μm). Accordingly, parasitic capacitance formed between the touch sensor metal and the second electrode E2 of the light emitting element ED may be reduced or prevented, thereby preventing a decrease in touch sensitivity which might otherwise be caused by the parasitic capacitance.

Without the touch buffer film T-BUF, the touch sensor metal including the X-touch and Y-touch electrodes X-TE and Y-TE and the X-touch and Y-touch electrode connection lines X-CL and Y-CL may be disposed on the encapsulation portion ENCAP.

Further, the touch buffer film T-BUF may block penetration of a chemical solution (e.g., developer or etchant) used in a manufacturing process of the touch sensor metal disposed on the touch buffer film T-BUF or external moisture into the light emitting layer EL containing an organic material. Accordingly, the touch buffer film T-BUF may prevent damage to the light emitting layer EL vulnerable to a chemical solution or moisture.

The touch buffer film T-BUF may be formed at a low temperature equal to or lower than a certain temperature (e.g., 100° C.) to reduce damage to the light emitting layer EL containing an organic material vulnerable to high temperature, and is formed of an organic insulation material having a low dielectric constant of 1 to 3. For example, the touch buffer film T-BUF may be formed of an acrylic-based, epoxy-based, or siloxane-based material. The touch buffer film T-BUF of an organic insulating material, which has planarization performance, may reduce damage to each of the encapsulation layers PAS1, PCL, and PAS2 in the encapsulation portion ENCAP and cracks of the touch sensor metal formed on the touch buffer film T-BUF which might otherwise be caused by bending of the OLED device.

According to the mutual-capacitance-based touch sensor structure, the X-touch electrode lines X-TEL and the Y-touch electrode lines Y-TEL may be disposed on the touch buffer film T-BUF, crossing each other.

The Y-touch electrode lines Y-TEL may include a plurality of Y-touch electrodes Y-TE and a plurality of Y-touch electrode connection lines Y-CL that electrically couple between the plurality of Y-touch electrodes Y-TE.

As illustrated in FIG. 9, the plurality of Y-touch electrodes Y-TE and the plurality of Y-touch electrode connection lines Y-CL are disposed on different layers with a touch insulation film ILD therebetween.

The plurality of Y-touch electrodes Y-TE may be spaced from each other at regular intervals along the y-axis direction. Each of the plurality of Y-touch electrodes Y-1B may be electrically coupled to another Y-touch electrode Y-TE adjacent in the y-axis direction through a Y-touch electrode connection line Y-CL.

Each Y-touch electrode connection line Y-CL may be formed on the touch buffer film T-BUF and exposed through touch contact holes penetrating through the touch insulation film ILD, and may be electrically coupled to two adjacent Y touch electrodes Y-TE in the y-axis direction.

The Y-touch electrode connection line Y-CL may be disposed to overlap with a bank BANK. Accordingly, it is possible to prevent the Y-touch electrode connection line Y-CL from decreasing an aperture ratio.

The X-touch electrode lines X-TEL may include a plurality of X-touch electrodes X-TE and a plurality of X-touch electrode connection lines X-CL that electrically couple between the plurality of X-touch electrodes X-TE. The plurality of X-touch electrodes X-TE and the plurality of X-touch electrode connection lines X-CL are disposed on different layers with the touch insulation layer ILD therebetween.

The plurality of X-touch electrodes X-TE may be spaced from each other at regular intervals along the x-axis direction on the touch insulation film ILD. Each of the plurality of X-touch electrodes X-TE may be electrically coupled to another X-touch electrode X-TE adjacent in the x-axis direction through a X-touch electrode connection line X-CL.

Each X-touch electrode connection line X-CL may be disposed on the same plane as the X-touch electrodes X-TE, and electrically coupled to or integrated with two adjacent X touch electrodes X-TE in the x-axis direction, without contact holes.

The X-touch electrode connection line X-CL may be disposed to overlap with a bank BANK. Accordingly, it is possible to prevent the X-touch electrode connection line X-CL from decreasing an aperture ratio.

The Y-touch electrode lines Y-TEL may be electrically coupled to the touch driving circuit TDC through the Y-touch routing lines Y-TL and the Y-touch pads Y-TP Similarly, the X-touch electrode lines X-TEL may be electrically coupled to the touch driving circuit TDC through the X-touch routing lines X-TL and the X-touch pads X-TP.

A pad cover electrode may be further disposed to cover the X-touch pads X-TP and the Y-touch pads Y-TP.

The X-touch pads X-TP may be formed separately from the X-touch routing lines X-TL, or may be extended from the X-touch routing lines X-TL. The Y-touch pads Y-TP may be formed separately from the Y-touch routing lines Y-TL, or may be extended from the Y-touch routing lines Y-TL.

When the X-touch pads X-TP are extended from the X-touch routing lines X-TL, and the Y-touch pads Y-TP are extended from the Y-touch routing lines Y-TL, the X-touch pads X-TP, the X-touch routing lines X-TL, the Y-touch pads Y-TP, and the Y-touch routing lines Y-TL may be formed of the same first conductive material. The first conductive material may be a metal having good corrosion resistance, acid resistance, and conductivity, such as Al, Ti, Cu, and Mo, which may be formed into a single layer or multiple layers.

For example, the X-touch pads X-TP, the X-touch routing lines X-TL, the Y-touch pads Y-TP, and the Y-touch routing lines Y-TL may be formed of the first conductive material in a 3-layer stack such as Ti/Al/Ti or Mo/Al/Mo.

The pad cover electrode that may cover the X-touch pads X-TP and the Y-touch pads Y-TP may be formed of the same second conductive material as the X-touch and Y-touch electrodes X-TE and Y-TE. The second conductive material may be a transparent conductive material such as ITO or IZO having strong corrosion resistance and acid resistance. The pad cover electrode may be formed to be exposed by the touch buffer film T-BUF to be bonded to the touch driving circuit TDC or a circuit film on which the touch driving circuit TDC is mounted.

The touch buffer film T-BUF may be formed to cover the touch sensor metal, thereby reducing corrosion of the touch sensor metal by external moisture or the like. For example, the touch buffer film T-BUF may be formed of an organic insulation material, or may be a circular polarization plate or an epoxy or acrylic film. The touch buffer film T-BUF may not exist on the encapsulation portion ENCAP. That is, the touch buffer film T-BUF may not be an essential component.

The Y-touch routing lines Y-TL may be electrically coupled to the Y-touch electrodes Y-TE through touch routing line contact holes or integrated with the Y-touch electrodes Y-TE.

The Y-touch routing lines Y-TL may be extended to the non-active area NA, pass the top and side surfaces of the encapsulation portion ENCAP and the top and side surfaces of the dam DAM, and be electrically coupled to the Y-touch pads Y-TP. Accordingly, the Y-touch routing lines Y-TL may be electrically coupled to the touch driving circuit TDC through the Y-touch pads Y-TP.

The Y-touch routing lines Y-TL may transfer the touch sensing signal received from the Y-touch electrodes Y-TE, to the touch driving circuit TDC or the touch driving signal received from the touch driving circuit TDC to the Y-touch electrodes Y-TE.

The X-touch routing lines X-TL may be electrically coupled to the X-touch electrodes X-TE through touch routing line contact holes or integrated with the X-touch electrodes X-TE.

The X-touch routing lines X-TL may be extended to the non-active area NA, pass the top and side surfaces of the encapsulation portion ENCAP and the top and side surfaces of the dam DAM, and be electrically coupled to the X-touch pads X-TP. Accordingly, the X-touch routing lines X-TL may be electrically coupled to the touch driving circuit TDC through the X-touch pads X-TP.

The X-touch routing lines X-TL may transfer the touch driving signal received from the touch driving circuit TDC to the X-touch electrodes X-TE, and the touch sensing signal received from the X-touch electrodes X-TE to the touch driving circuit TDC.

The arrangement of the X-touch routing lines X-TL and the Y-touch routing lines Y-TL may be changed in various manners according to a panel design.

A touch protection film PAC may be disposed on the X-touch electrodes X-TE and the Y-touch electrodes Y-TE. The touch protection film PAC may be extended to before or after the dam DAM and thus disposed on the X-touch routing lines X-TL and the Y-touch routing lines Y-TL.

The cross-sectional view of FIG. 9 conceptually illustrates the structure. The position, thickness, or width of each pattern (each layer or electrode) may vary according to a viewing direction or location, the connection structures of various patterns may also be changed, and a layer may be added to, omitted from, or integrated with the illustrated layers. For example, the width of a bank BANK may be narrower than shown in the drawing, and the height of the dam DAM may be lower or higher than shown in the drawing. Further, the cross-sectional view of FIG. 9 illustrates the structure in which a touch electrode TE and a touch routing line TL are disposed on the entirety of a subpixel SP, in order to show an exemplary structure connected to a touch pad TP along the inclined surfaces of the touch routing wire TL and the encapsulation portion ENCAP. However, when the touch electrode TE is the afore-mentioned mesh type, an opening OA of the touch electrode TE may be positioned on the light emitting area of the subpixel SP. Further, a color filter CF may be further disposed on the encapsulation portion ENCAP. The color filter CF may be positioned on the touch electrodes TE, or between the encapsulation portion ENCAP and the touch electrodes TE.

Figure 10:
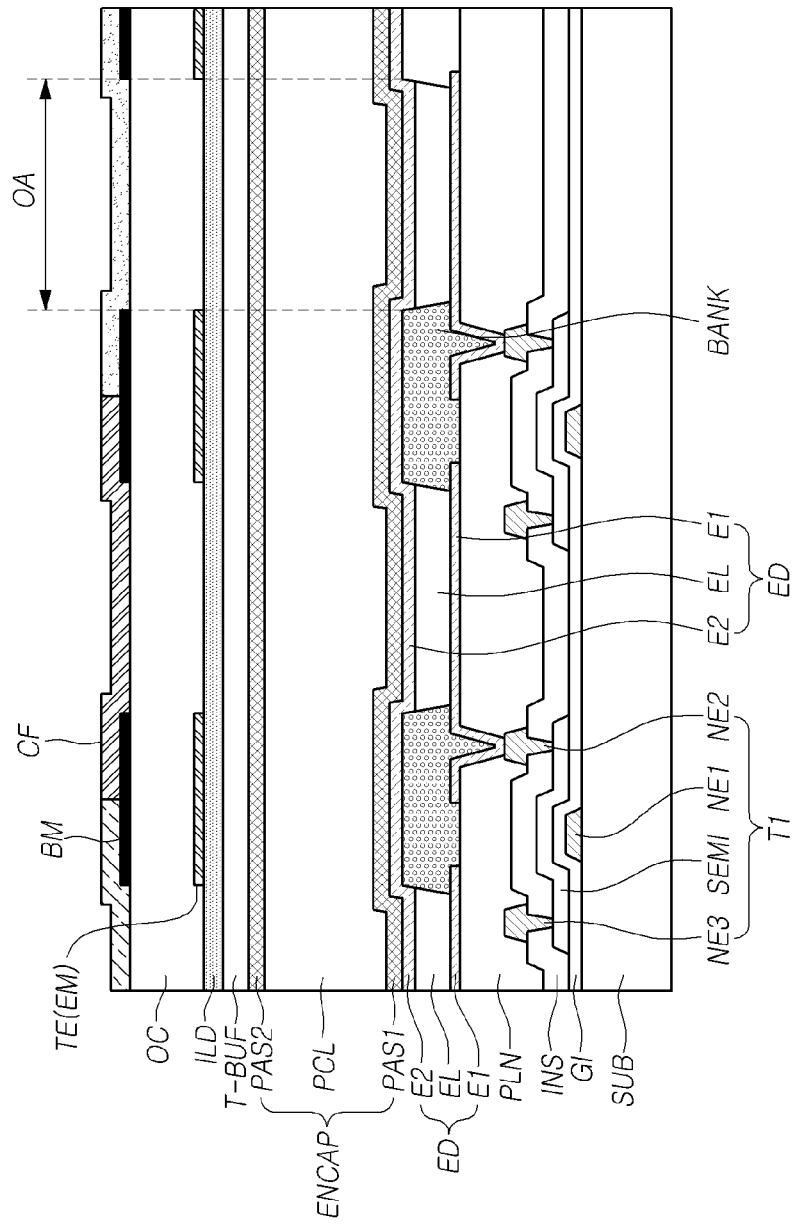
FIGS. 10 and 11 are diagrams illustrating exemplary cross-section structures of the display panel, when the display panel includes a color filter according to embodiments of the present disclosure.
Figure 11:
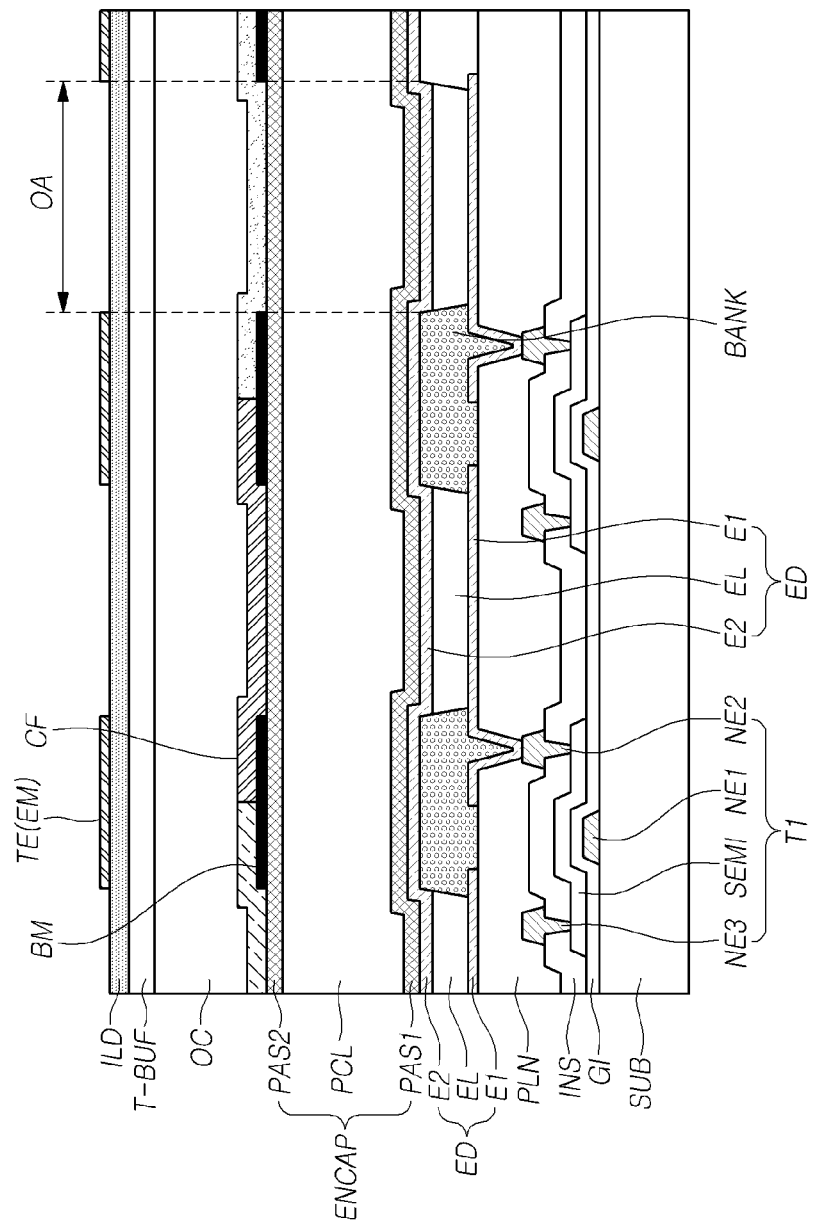

FIGS. 10 and 11 are diagrams illustrating exemplary cross-sectional structures of the display panel DISP, when the display panel DISP includes the color filter CF according to embodiments of the present disclosure.

Referring to FIGS. 10 and 11, when the touch panel TSP is built in the display panel DISP, and the display panel DISP is implemented as an OLED panel, the touch panel TSP may be positioned on the encapsulation portion ENCAP in the display panel DISP. In other words, the touch sensor metal including the plurality of touch electrodes TE and the plurality of touch routing lines TL may be positioned on the encapsulation portion ENCAP in the display panel DISP.

As described before, as the touch electrodes TE, are formed on the encapsulation portion ENCAP, the touch electrodes TE, may be formed without significantly affecting display performance and display-related layer formation.

Referring to FIGS. 10 and 11, the second electrode E2, which may be a cathode electrode of an OLED, may be positioned under the encapsulation portion ENCAP.

The thickness T of the encapsulation portion ENCAP may be, for example, 1 micrometer or more.

As described before, parasitic capacitance generated between the second electrode E2 of the OLED and a touch electrode TE may be reduced by setting the thickness of the encapsulation portion ENCAP to 1 micrometer or more. Accordingly, it is possible to reduce a decrease in touch sensitivity, caused by parasitic capacitance.

As described above, in each of the plurality of touch electrodes TE, the electrode metal EM is patterned into a mesh with two or more openings OA, and each of the two or more openings OA may correspond to one or more subpixels or the light emitting areas of the one or more subpixels, when viewed from the vertical direction.

As described above, the electrode metal EM of the touch electrode TE may be patterned such that when viewed from a plane, the light emitting areas of one or more subpixels exist in correspondence with the position of each of two or more openings OA present in the area of the touch electrode TE. Therefore, the light emitting efficiency of the display panel DISP may be increased.

As illustrated in FIGS. 10 and 11, black matrices BM may be disposed on the display panel DISP, and color filters CF may be further disposed on the display panel DISP.

The positions of the black matrices BM may correspond to those of the electrode metals EM of the touch electrodes TE.

The positions of a plurality of color filters CF correspond to the positions of a plurality of touch electrodes TE or the electrode metals EM of the plurality of touch electrodes 1B.

As described above, since the plurality of color filters CF are located at positions corresponding to the positions of a plurality of openings OA, the light emission performance of the display panel DISP may be improved.

The vertical positional relationship between the plurality of color filters CF and the plurality of touch electrodes TE is described below.

As illustrated in FIG. 10, the plurality of color filters CF and the black matrices BM may be positioned on the plurality of touch electrodes TE.

In this case, the plurality of color filters CF and the black matrices BM may be positioned on an overcoat layer OC disposed on the plurality of touch electrodes TE. The overcoat layer OC may be identical to or different from the touch protection film PAC illustrated in FIG. 9.

Alternatively, as illustrated in FIG. 11, the plurality of color filters CF and the black matrices BM may be positioned under the plurality of touch electrodes TE.

In this case, the plurality of touch electrodes TE may be located on the overcoat layer OC disposed on the color filters CF and the black matrices BM. The overcoat layer OC may be identical to or different from the touch buffer film T-BUF or the touch insulation film ILD illustrated in FIG. 9. Alternatively, the touch buffer film T-BUF or the touch insulation film ILD may be disposed separately from the overcoat layer OC.

Since the vertical positional relationship between the touch electrodes TE and the components for display driving is adjusted in this manner, the components for touch sensing may be arranged without degrading display performance.

As the touch electrodes TE and the lines are disposed on the electrodes and lines for display driving, the components for display driving may affect the touch sensing performance.

Embodiments of the present disclosure provide a method of arranging components for touch sensing without degrading display performance, and a method of preventing components for display driving from degrading touch sensing performance.

Figure 12:
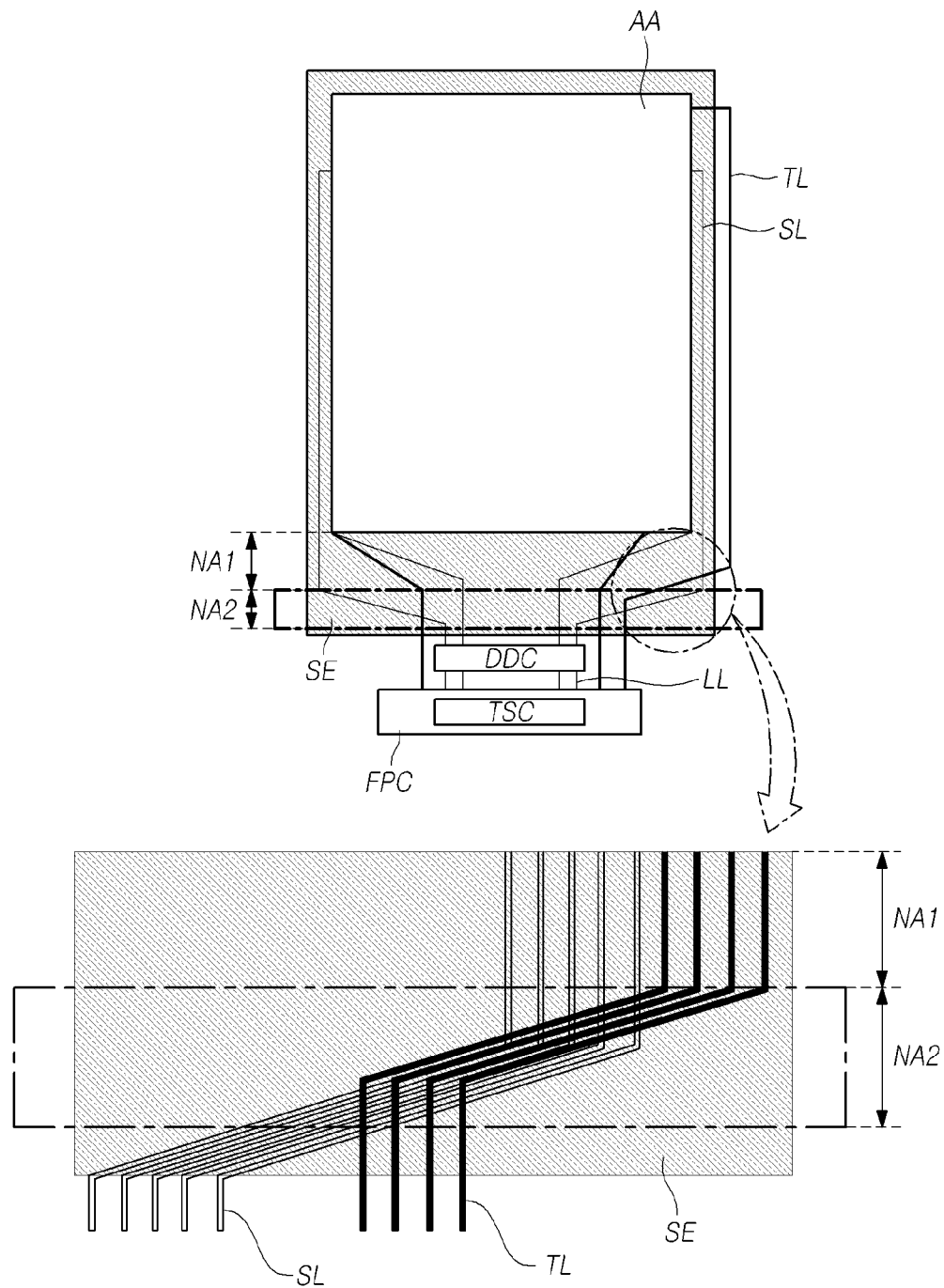
FIG. 12 is a diagram illustrating an exemplary plane structure of a shielding electrode disposed in the touch display device according to embodiments of the present disclosure.

FIG. 12 is a diagram illustrating an exemplary plane structure of the touch display device in which a shielding electrode SE is disposed according to embodiments of the present disclosure.

Referring to FIG. 12, a plurality of touch electrodes TE may be disposed in the active area AA, and a plurality of touch routing lines TL coupled to the touch electrodes TE may be disposed in the non-active area NA defined outside the active area AA on the display panel DISP.

As described before, the touch electrodes TE and the touch routing lines TL may be disposed on the encapsulation portion ENCAP.

Further, electrodes or lines for display driving may be disposed under the encapsulation portion ENCAP, and a plurality of signal lines SL to which a signal for display driving is applied may be arranged in the non-active area NA.

The signal lines SL may be lines that supply the data voltage VDATA output from the data driving circuit DDC for driving subpixels SP, or lines that supply the driving voltage VDD. Alternatively, the signal lines SL may be lines (e.g., clock lines) that supply an input signal to a circuit such as the gate driving circuit GDC.

The signal lines SL may be coupled to, for example, the data driving circuit DDC, and the data driving circuit DDC may be coupled to a flexible printed circuit FPC through link lines LL. Also, the touch sensing circuit TSC may be disposed on the flexible printed circuit FPC. Accordingly, the touch routing lines TL may be connected to the flexible printed circuit FPC and to the touch sensing circuit TSC.

The signal lines SL may be disposed without overlapping with the touch routing lines TL in the non-active area NA to prevent noise during detection of the touch sensing signal through the touch routing lines TL.

The signal lines SL may be coupled to the data driving circuit DDC, and the touch routing lines TL may be coupled to a pad portion, to be coupled to the touch sensing circuit TSC. As the lines gather to the pad portion, there may be a part over which the signal lines SL and the touch routing lines TL overlap with each other.

For example, as illustrated in FIG. 12, the signal lines SL and the touch routing lines TL may not overlap with each other in a first non-active area NA1 adjacent to the active area AA in an area between the active area AA and the driving circuit.

On the other hand, as the signal lines SL and the touch routing lines TL gather to be coupled to the pad portion, there may be a part over which the signal lines SL and the touch routing lines TL may overlap with each other in a second non-active area NA2 with the pad portion located therein, which is adjacent to the driving circuit.

The touch display device according to embodiments of the present disclosure may include a shielding electrode SE disposed between a layer on which the signal lines SL are disposed and a layer on which the touch routing lines TL are disposed in the non-active area NA in order to reduce noise of the touch sensing signal which might otherwise be caused by parasitic capacitance between the signal lines SL and the touch routing lines TL in the non-active area NA.

The shielding electrode SE may overlap at least partially with the signal lines SL, and may be disposed in an area including an area where the signal lines SL and the touch routing lines TL overlap with each other.

The shielding electrode SE may be disposed to surround the outer periphery of the active area AA, and at least a part of the shielding electrode SE may be located inside the boundary of the active area AA. Alternatively, the shieling electrode SE may be disposed outside the active area AA, apart from the boundary of the active area AA.

That is, as the shielding electrode SE is disposed to surround the active area AA, overlapping with the area where the touch routing lines TL overlap with the signal lines SL, the effects of noise caused by the signal lines SL on the touch routing lines SL may be reduced.

Further, while the shielding electrode SE may be an electrode disposed separately for noise shielding in the non-active area NA of the display panel DISP, the shielding electrode SE may be an electrode disposed in the non-active area NA of the display panel DISP, to which a constant voltage is applied.

For example, the shielding electrode SE may be disposed in the non-active region NA, electrically coupled to the second electrodes E2 of the light emitting elements ED disposed in the active area AA. Further, the shielding electrode SE may be electrically coupled to a common voltage supply line CVL that supplies a common voltage being the base voltage VSS to the second electrodes E2.

That is, the shielding electrode SE may be connected between the second electrodes E2 which are the common electrodes of the light emitting elements ED and the common voltage supply line CVL, and disposed between the layer on which the signal lines SL are disposed and the layer on which the touch routing lines TL are disposed.

As such, the shielding electrode SE coupled to the common voltage supply line CVL is disposed on the signal lines SL to supply the common voltage to the common electrodes disposed in the active area AA. Therefore, the effects of noise caused by the signal lines SL on the touch routing lines TL positioned on the shielding electrode SE may be reduced.

Therefore, the shielding electrode SE may offer the benefit of obviating the need for disposing an additional electrode to shield noise caused by the signal lines SL.

Further, the common voltage supply line CVL connected to the shielding electrode SE may be located in the same layer as any one of the signal lines SL disposed under the shielding electrode SE.

Further, the common voltage supply line CVL may be located outside the other signal lines SL in the non-active area NA in order to make the shielding electrode SE overlap with the arrangement area of the signal lines SL.

FIGS. 13A, 13B, 14, and 15 are diagrams illustrating exemplary cross-sectional structures in which the shielding electrode SE is disposed in the touch display device illustrated in FIG. 12.

Figure 13A:
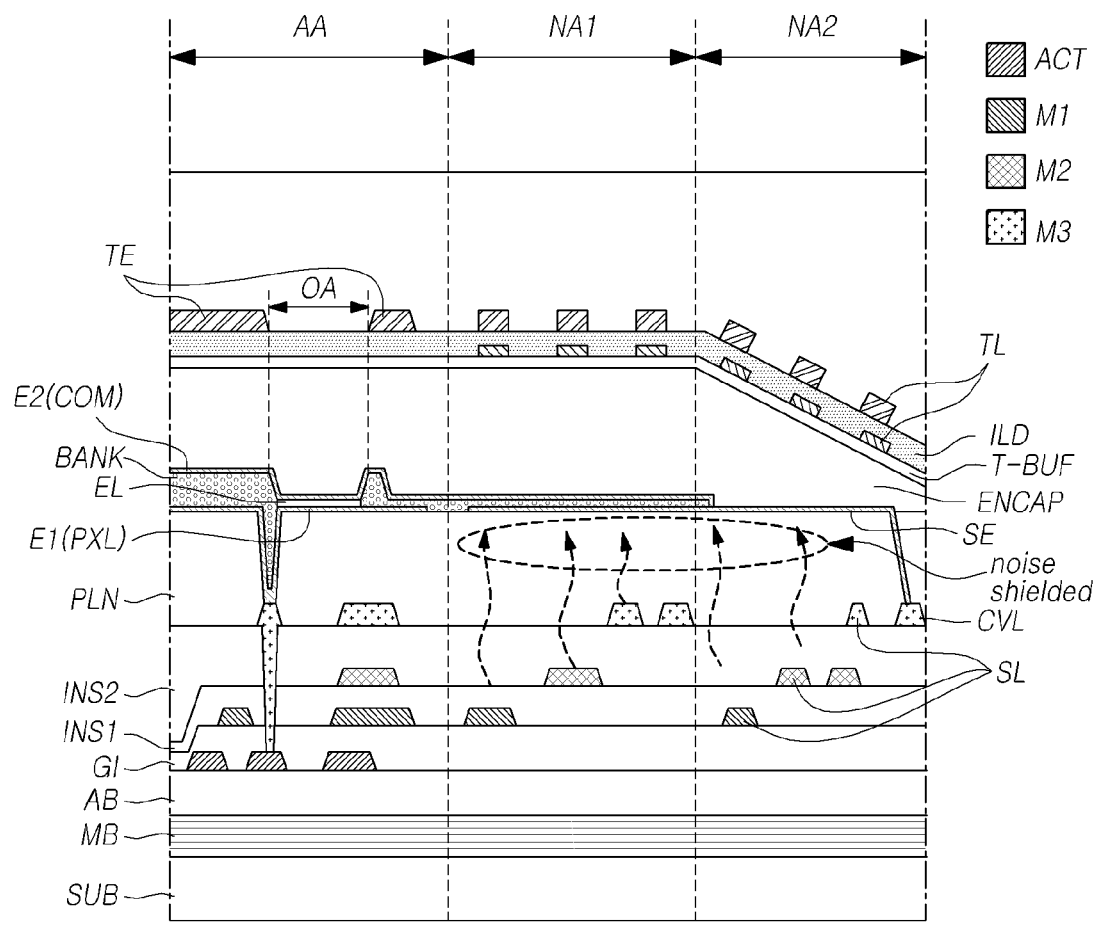
FIGS. 13A, 13B, 14, and 15 are diagrams illustrating exemplary cross-section structures of the touch display device illustrated in FIG. 12 in which a shielding electrode is disposed according to embodiments of the present disclosure.
Figure 13B:
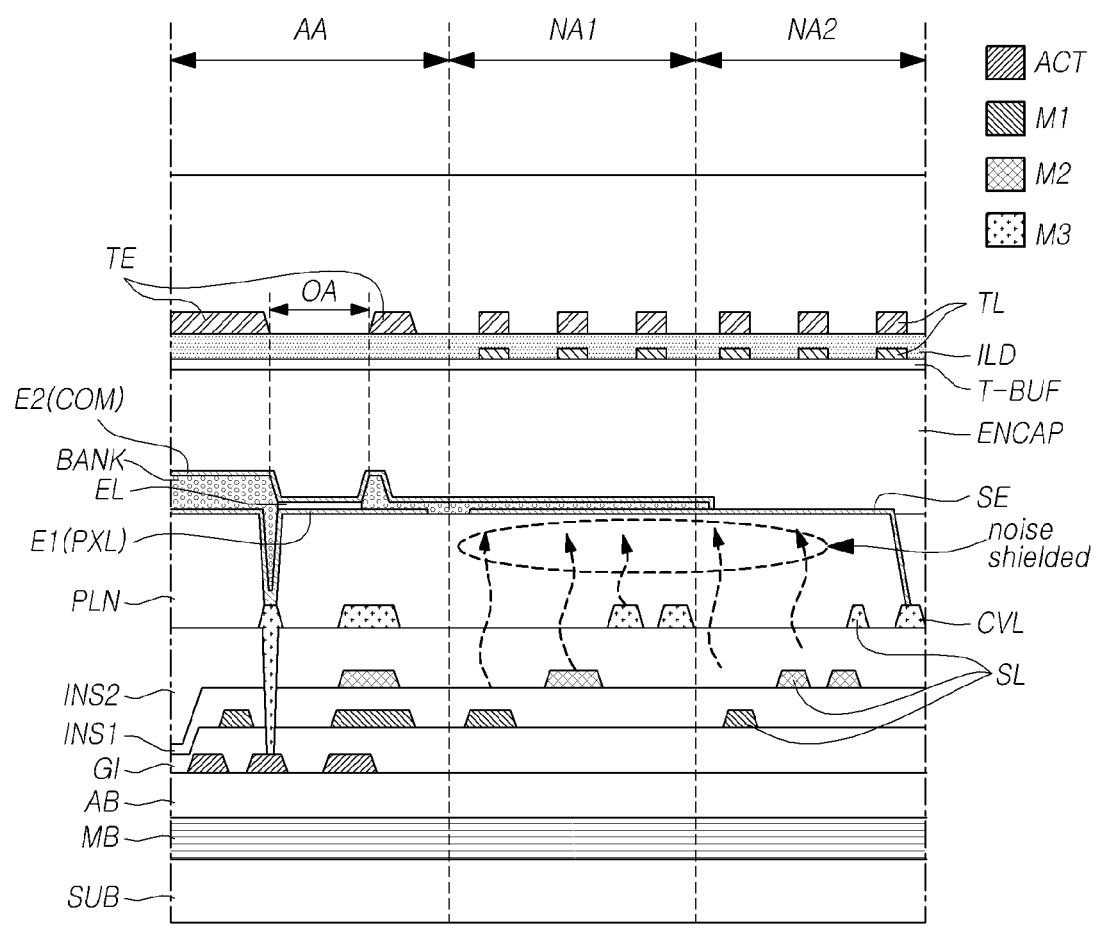

Referring to FIGS. 13A and 13B, a multi-buffer layer MB and an active buffer layer AB may be disposed on the substrate SUB, and an active layer ACT may be disposed on the active buffer layer AB. A gate insulation layer GI may be disposed on the active layer ACT, and a first metal M1 may be disposed on the gate insulation layer GI. The first metal M1 may be a gate metal.

A first insulation layer INS1 may be disposed on the first metal M1, and a second metal M2 and a second insulation layer INS2 may be sequentially disposed on the first insulation layer INS1. The second metal M2 may be an electrode for forming a capacitor.

A third metal M3 and the planarization layer PLN may be sequentially disposed on the second insulation layer INS2. The third metal M3 may be a source/drain metal.

The first electrode E1 constituting a pixel electrode PXL of each subpixel SP may be disposed on the planarization layer PLN, the light emitting layer EL and a bank BANK may be disposed on the first electrode E1, and the second electrode E2, which is a common electrode COM, may be disposed.

The encapsulation portion ENCAP may be disposed on the second electrode E2, and the touch electrodes TE and the touch routing lines TL may be disposed on the encapsulation portion ENCAP.

In this case, the shielding electrode SE may be disposed between a layer on which the touch routing lines TL are disposed and a layer on which signal lines SL are disposed in the non-active area NA. For example, the shielding electrode SE may be disposed between the planarization layer PLN and the encapsulation portion ENCAP. That is, the shielding electrode SE may be disposed in the same layer as the pixel electrode PXL constituting the first electrode E1 of the light emitting element ED. Further, the shielding electrode SE may be formed of the same material as the pixel electrode PXL.

The shielding electrode SE may be electrically coupled between the second electrode E2, which is the common electrode COM, and the common voltage supply line CVL.

The common voltage supply line CVL may be disposed in the same layer as the third metal M3 disposed on the uppermost layer of the signal lines SL positioned under the shielding electrode SE.

The common voltage supply line CVL may be disposed outside a plurality of signal lines SL disposed in the non-active area NA.

That is, the common voltage supply line CVL may be disposed on the outermost side of the signal lines arranged in the non-active area NA, and the plurality of signal lines SL located under the encapsulation portion ENCAP may be disposed between the active area AA and the common voltage supply line CVL.

Therefore, as the shielding electrode SE is disposed to surround the signal lines SL on the plurality of signal lines SL, the shielding electrode SE may prevent formation of parasitic capacitance between the signal lines SL and the touch routing lines TL. Further, the effects of noise caused by the signal lines SL on the touch routing lines TL may be reduced.

Further, since a constant voltage such as a common voltage is applied to the shielding electrode SE, the shielding electrode SE may block noise caused by the signal lines SL and may not affect the touch routing lines TL disposed on the encapsulation portion ENCAP.

The encapsulation portion ENCAP on the shielding electrode SE may include a flat area and an inclined area, as illustrated in FIG. 13A. The encapsulation portion ENCAP may include the inclined area in an outer area of the non-active area NA, and the shielding electrode SE may also be disposed under the inclined area of the encapsulation portion ENCAP, thereby blocking noise caused by the signal lines SL. Alternatively, as illustrated in FIG. 13B, the encapsulation portion ENCAP may be disposed in a flat structure on the shielding electrode SE, so that the touch routing lines TL are kept apart from the shielding electrode SE by a predetermined distance on the area where the shielding electrode SE is disposed. Accordingly, the indirect effects of noise caused by the signal lines SL on the touch routing lines TL through the shielding electrode SE may also be prevented.

The common voltage supply line CVL coupled to the shielding electrode SE may be in the same layer as a signal line SL other than the third metal M3 disposed in the non-active area NA.

Figure 14:
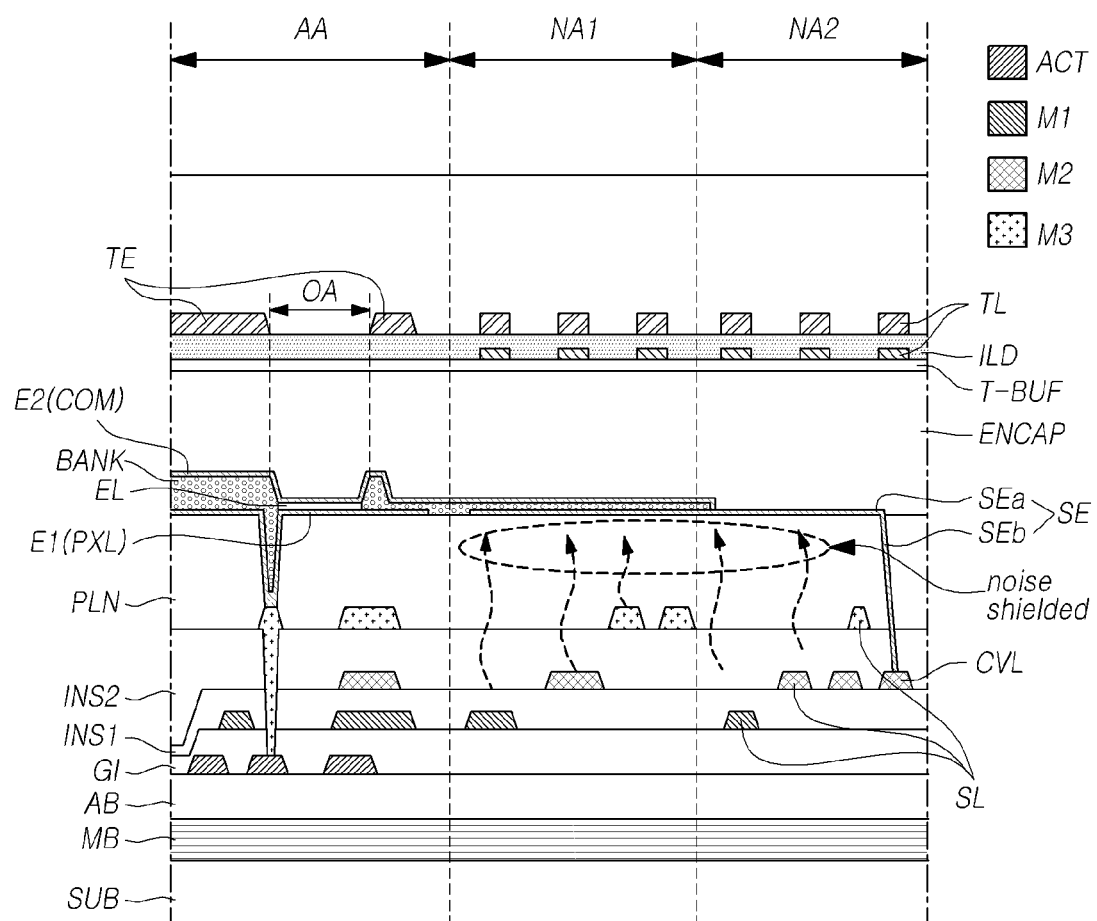

For example, referring to FIG. 14, the common voltage supply line CVL which is disposed in the non-active area NA and electrically coupled to the shielding electrode SE may be located in the same layer as the second metal M2 under the shielding electrode SE. Further, the common voltage supply line CVL may be formed of the same material as the second metal M2.

The common voltage supply line CVL may be disposed outside the other signal lines SL in the non-active area NA. Therefore, the shielding electrode SE electrically coupled between the common voltage supply line CVL and the common electrode COM may cover an area in which a plurality of signal lines SL are disposed.

As the common voltage supply line CVL is formed of the second metal M2 under the third metal M3, a signal line SL formed of the third metal M3 may be positioned on the common voltage supply line CVL. Accordingly, the shielding electrode SE extended to be coupled to the common voltage supply line CVL may be positioned on one side of the signal line SL formed of the third metal M3.

That is, the shielding electrode SE may include a first part SEa positioned on a signal line SL and a second part SEb positioned on one side of the signal line SL.

As the shielding electrode SE is disposed on one side of the signal line SL, the shielding electrode SE may also prevent the signal line SL from forming parasitic capacitance in a slanted direction with respect to the touch routing lines TL.

Therefore, the shielding electrode SE may further reduce noise caused by parasitic capacitance between the signal lines SL and the touch routing lines TL.

Figure 15:
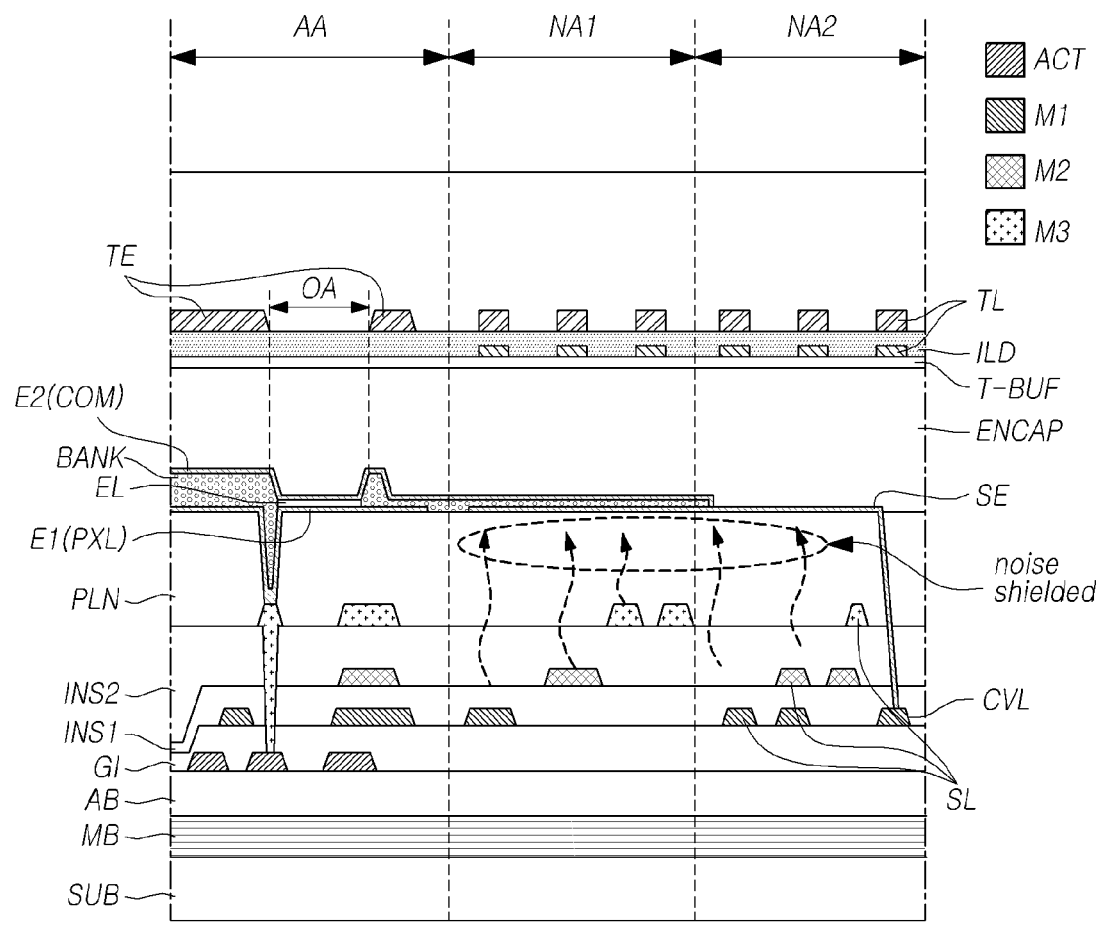

In another example, referring to FIG. 15, the common voltage supply line CVL electrically coupled to the shielding electrode SE may be disposed in the same layer as the first metal M1. Further, the common voltage supply line CVL may be formed of the same material as the first metal M1.

As the common voltage supply line CVL is positioned in the same layer as the first metal M1 disposed on the lowest layer of a plurality of signal lines SL under the shielding electrode SE, the shielding electrode SE electrically coupled to the common voltage supply line CVL may surround the plurality of signal lines SL as a whole.

Therefore, the noise shielding performance of the shielding electrode SE against the signal lines SL may further be increased.

That is, embodiments of the present disclosure provide a structure in which the shielding electrode SE may shield noise caused by the signal lines SL by disposing the shielding electrode SE electrically coupled between the common electrode COM and the common voltage supply line CVL and positioning the plurality of signal lines SL inward of the common voltage supply line CVL.

Accordingly, the touch routing lines TL on the shielding electrode SE are not affected by the signal lines SL, thereby improving touch sensing performance.

Further, the common voltage supply line CVL coupled to the shielding electrode SE may provide the noise shielding function in some cases.

Figure 16:
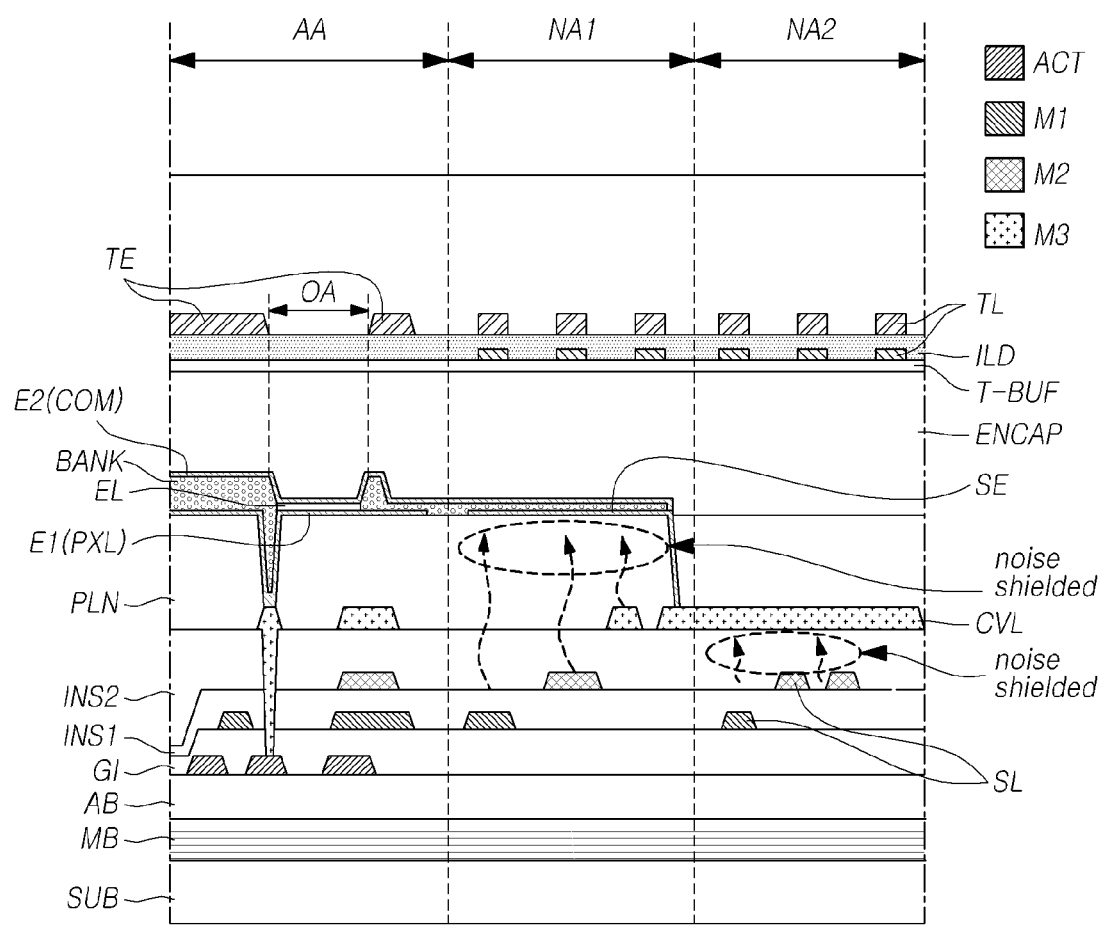
FIG. 16 is a diagram illustrating another exemplary cross-section structure of the touch display device in which a shielding electrode is disposed according to embodiments of the present disclosure.

FIG. 16 is a diagram illustrating another exemplary cross-section structure of the touch display device in which the shielding electrode SE is disposed according to embodiments of the present disclosure.

Referring to FIG. 16, the shielding electrode SE electrically coupled to the common voltage supply line CVL may be disposed under the encapsulation portion ENCAP in the non-active area NA. This shielding electrode SE may reduce noise caused by the signal lines SL under the shielding electrode SE from affecting the touch routing lines TL on the encapsulation portion ENCAP.

The shielding electrode SE may be electrically coupled to the common voltage supply line CVL supplying a common voltage.

The common voltage supply line CVL may be disposed in the same layer as, for example, the third metal M3. Further, the common voltage supply line CVL may be formed of the same material as the third metal M3.

The width (or area) of the common voltage supply line CVL may be larger than the widths (or areas) of the other signal lines SL.

That is, among a plurality of signal lines SL disposed in the non-active area NA, the width of the common voltage supply line CVL coupled to the shielding electrode SE and supplying the common voltage may be larger than that of any other signal line SL.

The common voltage supply line CVL may overlap with other signal lines SL under the common voltage supply line CVL.

Therefore, the common voltage supply line CVL may block noise caused by the underlying signal lines SL from affecting the touch routing lines TL on the encapsulation portion ENCAP.

Further, as the width of the common voltage supply line CVL increases, the resistance of the lines may be reduced.

While the common voltage supply line CVL providing the noise shielding function is shown as disposed in the same layer as the third metal M3 by way of example, the common voltage supply line CVL may be disposed in the same layer as the first metal M1 or the second metal M2, while providing the noise shielding function.

That is, embodiments of the present disclosure may improve touch sensing performance by disposing the shielding electrode SE, which is positioned in the non-active area NA and electrically coupled to the common electrode COM, or the common voltage supply line CVL coupled to the shielding electrode SE between the signal lines SL and the touch routing lines TL and shielding noise caused by the signal lines SL.

Further, besides the shielding electrode SE, an additional electrode for noise shielding may be disposed in some cases.

Figure 17:
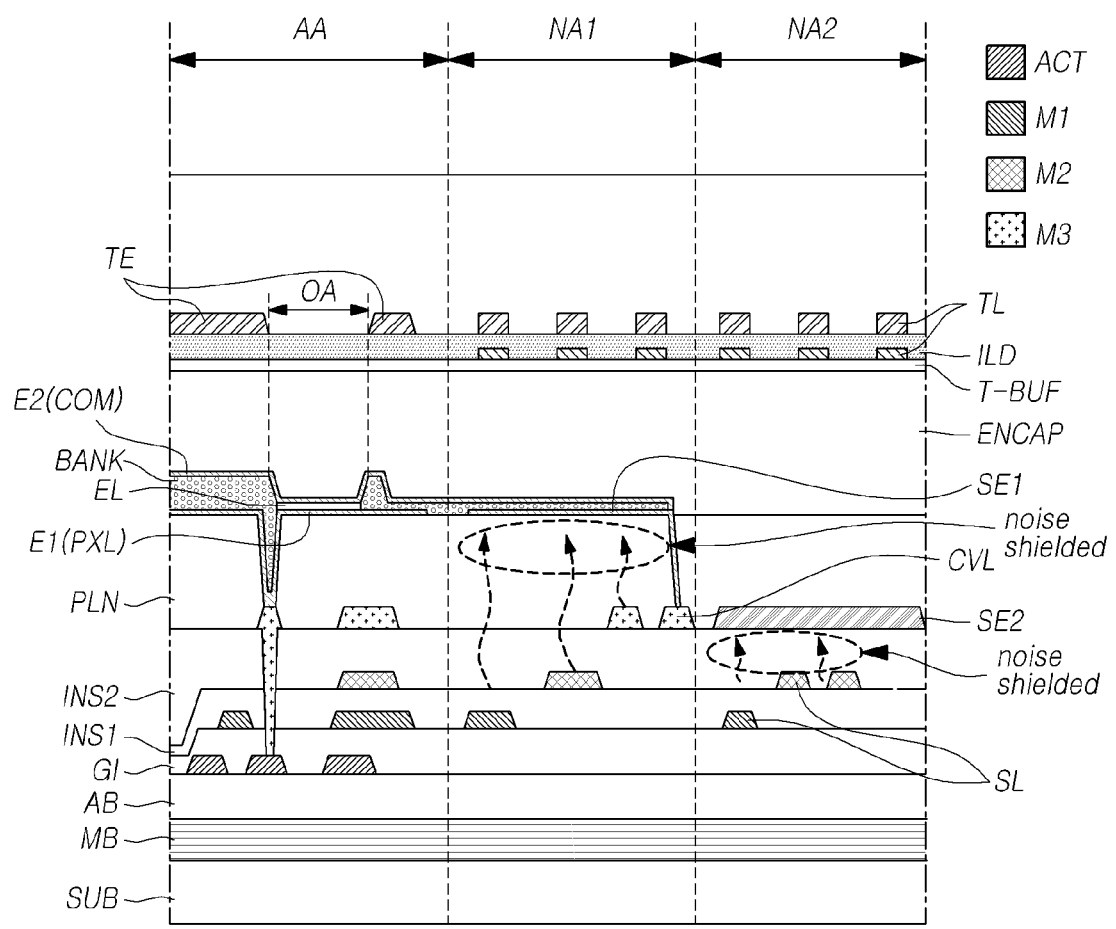
FIG. 17 is a diagram illustrating another exemplary cross-section structure of the touch display device in which a shielding electrode is disposed according to embodiments of the present disclosure.

FIG. 17 is a diagram illustrating another exemplary cross-section structure of the touch display device in which the shielding electrode SE is disposed according to embodiments of the present disclosure.

Referring to FIG. 17, a first shielding electrode SE1 may be disposed to be electrically coupled between the common electrode COM and the common voltage supply line CVL in the non-active area NA. The first shielding electrode SE1 may be located between layers in which touch routing lines TL are disposed and layers in which a plurality of signal lines SL are disposed.

A second shielding electrode SE2 may be disposed separately from the first shielding electrode SE1, outside the first shielding electrode SE1 in the non-active area NA.

The second shielding electrode SE2 may be disposed in the same layer as, for example, the third metal M3 disposed on the uppermost layer. The second shielding electrode SE2 may be formed of the same material as the third metal M3.

The second shielding electrode SE2 may be disposed outside the first shielding electrode SE1, that is, outside the common voltage supply line CVL, overlapping with a signal line SL positioned outside the common voltage supply line CVL.

Therefore, the second shielding electrode SE2 disposed separately from the first shielding electrode SE1 may shield noise caused by the signal lines SL, while covering an area which the first shielding electrode SE1 does not cover. As such, the common voltage supply line CVL may be extended to a part of the non-active area NA or the second shielding electrode SE2 may be formed of a metal positioned in a lower layer than the first shielding electrode SE1, thereby shielding noise caused by the signal lines SL. Because the extended common voltage supply line CVL or the second shielding electrode SE2 is located in a lower layer than the shielding electrode SE coupled to the common electrode COM or the first shielding electrode SE1, the extended common voltage supply line CVL or the second shielding electrode SE2 may be disposed in correspondence with the inclined area of the encapsulation portion ENCAP. That is, the distance between the shielding electrode SE and the touch routing lines TL may be kept to be a certain distance or larger by disposing the electrode for noise shielding in the inclined area of the encapsulation portion ENCAP in a lower layer than the electrode for noise shielding in the flat area of the encapsulation portion ENCAP. Therefore, noise caused by the signal lines SL may not indirectly affect the touch routing lines TL through the shielding electrode SE.

Further, when the second shielding electrode SE2 is disposed separately from the first shielding electrode SE1, the touch routing lines TL do not overlap with the signal lines SL in an area overlapping with the area between the first shielding electrode SE1 and the second shielding electrode SE2. Therefore, generation of noise from the signal lines SL may be reduced in an area which is not covered by the first shielding electrode SE1 and the second shielding electrode SE2.

A constant voltage may be applied to the second shielding electrode SE2. Alternatively, the same voltage as the common voltage applied to the first shielding electrode SE1 may be applied to the second shielding electrode SE2. In this case, a power source supplying the common voltage to the second shielding electrode SE2 may be identical to or separated from a power source supplying the common voltage to the first shielding electrode SE1.

Alternatively, the same signal as applied to the touch routing lines TL may be applied to the second shielding electrode SE2 in some cases. As the same signal as applied to the touch routing lines TL is applied to the second shielding electrode SE2, noise caused by the signal lines SL may be blocked and noise caused by parasitic capacitance between the second shielding electrode SE2 and the touch routing lines TL may also be prevented.

While the second shielding electrode SE2 may be disposed in the same layer as the common voltage supply line CVL coupled to the first shielding electrode SE1 as in the example of FIG. 17, the second shielding electrode SE2 may be disposed in a different layer from the common voltage supply line CVL.

For example, the second shielding electrode SE2 may be disposed in a higher layer than the common voltage supply line CVL.

In this case, the signal lines SL and the touch routing lines TL may further reduce an area in which overlap may occur in a slanted direction, thereby increasing the effect of noise shielding.

In another example, the second shielding electrode SE2 may be disposed in a lower layer than the common voltage supply line CVL. In some cases, a part of the second shielding electrode SE2 may be extended into the common voltage supply line CVL and thus increase a noise shielding area.

As described above, embodiments of the present disclosure may reduce noise caused by the signal lines SL from affecting the touch routing lines TL in an area which is not covered by the shielding electrode SE by additionally disposing an electrode for noise shielding in addition to the shielding electrode SE coupled between the common electrode COM and the common voltage supply line CVL.

Alternatively, the touch routing lines TL may be disposed without overlapping with the signal lines SL in the area which is not covered by the shielding electrode SE, so that the signal lines SL do not generate noise in the area in which the shielding electrode SE is not disposed.

Figure 18:
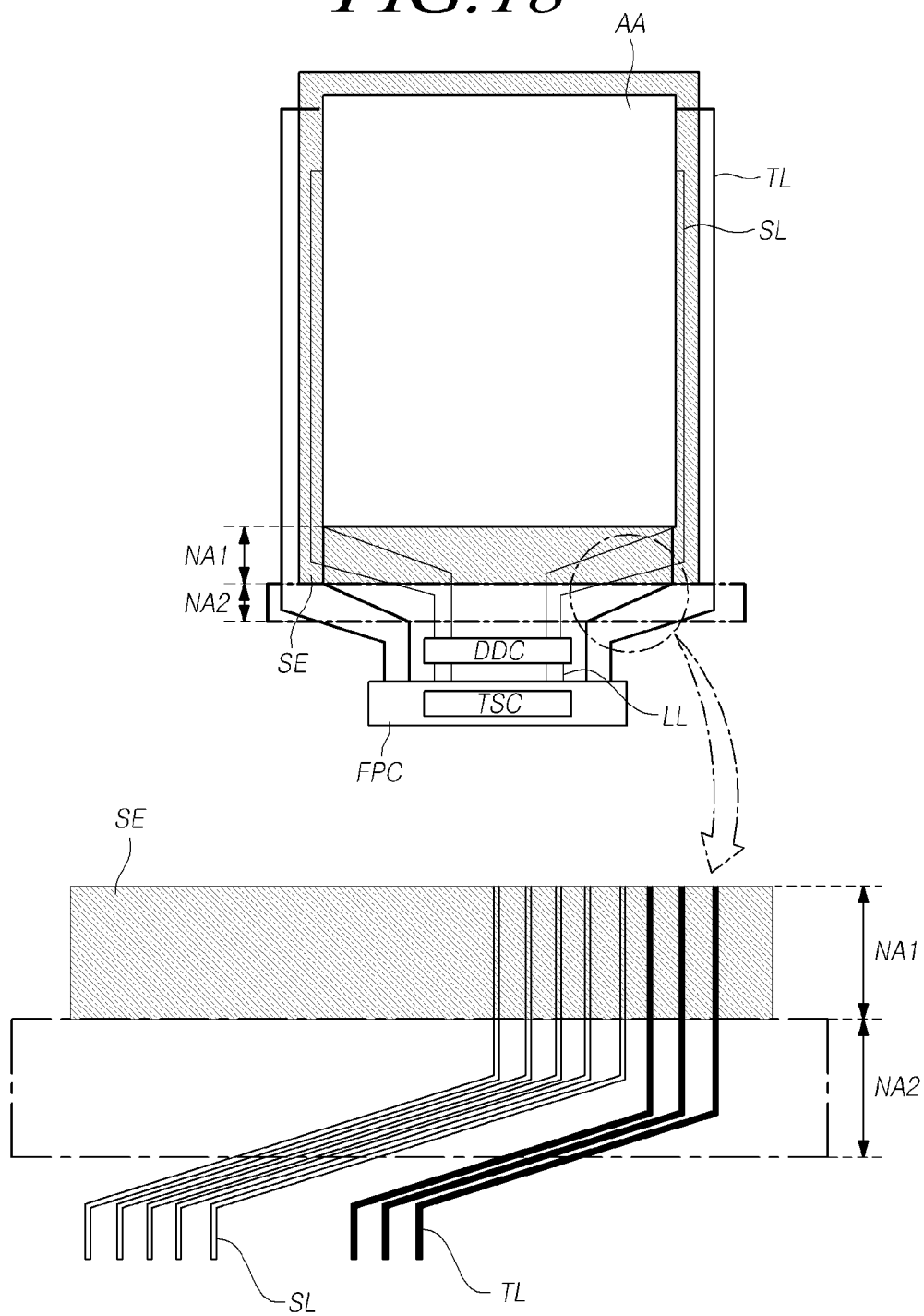
FIG. 18 is a diagram illustrating another exemplary cross-section structure of the touch display device in which a shielding electrode is disposed according to embodiments of the present disclosure.
Figure 19:
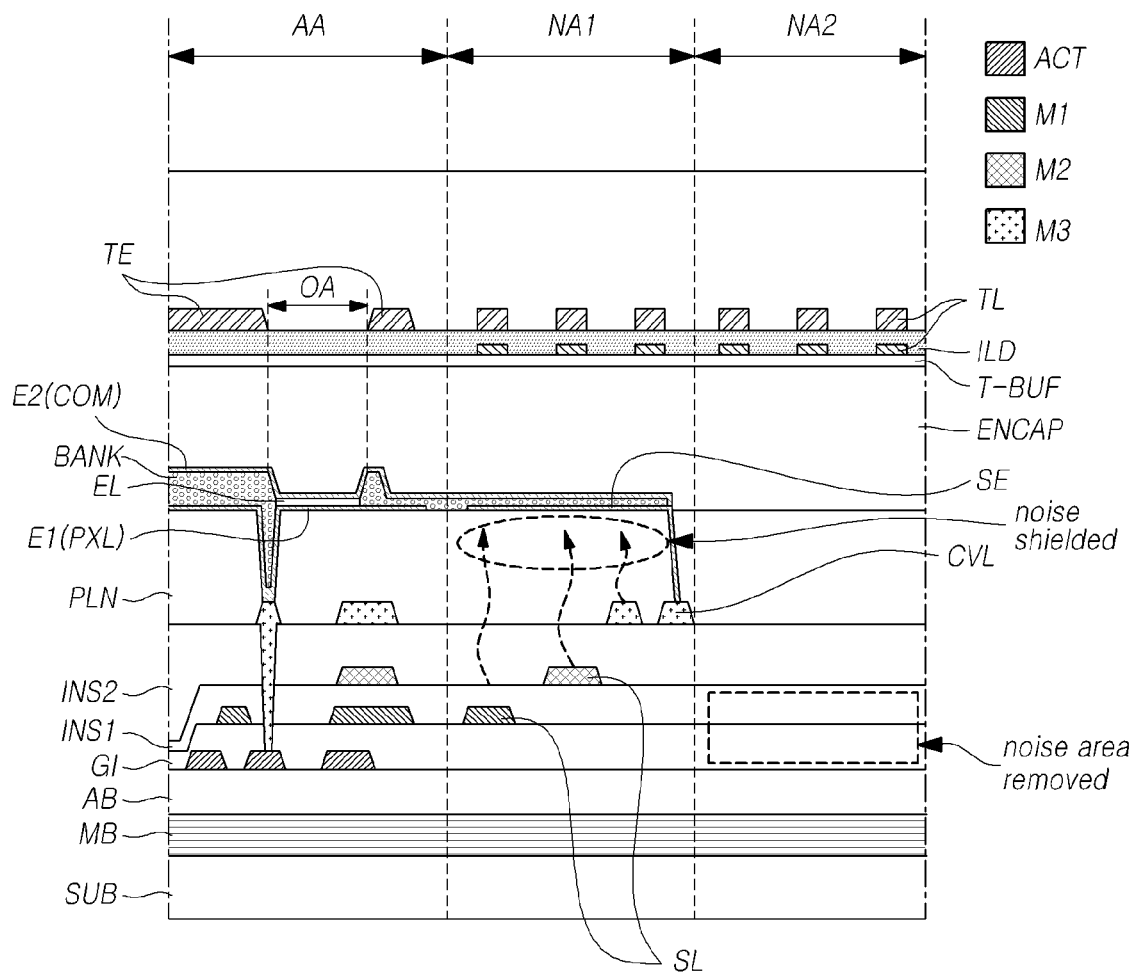
FIG. 19 is a diagram illustrating an exemplary cross-section structure of the touch display device illustrated in FIG. 18 in which a shielding electrode is disposed according to embodiments of the present disclosure.

FIG. 18 is a diagram illustrating another exemplary plane structure of the touch display device in which the shielding electrode SE is disposed according to embodiments of the present disclosure. FIG. 19 is a diagram illustrating an exemplary cross-section structure of the touch display device in which the shielding electrode SE is disposed, illustrated in FIG. 18.

Referring to FIGS. 18 and 19, the touch display device may include a first non-active area NA1 with the shielding electrode SE disposed therein and a second non-active area NA2 without the shielding electrode SE in the non-active area NA in some cases.

In this case, touch routing lines TL located in the first non-active area NA1 with the shielding electrode SE may partially overlap with signal lines SL located under the shielding electrode SE.

Even though the touch routing lines TL overlap with the signal lines SL, the existence of the shielding electrode SE between the touch routing lines TL and the signal lines SL may block noise caused by the signal lines SL.

Touch routing lines TL disposed in the second non-active area NA2 without any shielding electrode SE may be disposed without overlapping with signal lines SL.

That is, the touch routing lines TL may be disposed in an area other than an area overlapping with the area in which the signal lines SL are disposed, in the area without any shielding electrode SE.

As described above, the overlap structure between the touch routing lines TL and the signal lines SL is allowed in the area with the shielding electrode SE disposed therein, and the touch routing lines TL do not overlap with the signal lines SL in the area without any shielding electrode SE, in the non-active area NA. Therefore, noise caused by the signal lines may be reduced and the freedom of line design may be increased.

According to the above-described embodiments of the present disclosure, a shielding electrode SE, which is disposed in a non-active area NA and electrically coupled between a common electrode COM and a common voltage supply line CVL, is located between a touch routing line TL and a signal line SL. Therefore, an electrode disposed for supplying a common voltage may provide the function of shielding noise caused by the signal line SL.

Further, the width (or area) of the common voltage supply line CVL may be increased or an electrode which is not coupled to the common voltage supply line CVL may be additionally disposed in some cases, thereby shielding noise from the signal line SL.

In this manner, the electrode, which is disposed in the non-active area NA and to which a constant voltage is applied, is located between the touch routing line TL and the signal line SL. Therefore, the effects of noise caused by the signal line SL on the touch routing line TL may be reduced.

Further, an encapsulation portion ENCAP located on the shielding electrode SE has a planarized structure. The resulting maintenance of a certain distance between the shielding electrode SE and the touch routing line TL may reduce indirect noise from affecting the touch routing line TL through the shielding electrode SE.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A touch display device comprising:
   an active area in which a plurality of light emitting elements are disposed;
   a non-active area defined outside of the active area, in which a plurality of signal lines are disposed;
   an encapsulation portion disposed in the active area and the non-active area and located on the plurality of light emitting elements and the plurality of signal lines;
   a plurality of touch electrodes disposed in the active area on the encapsulation portion;
   a plurality of touch routing lines disposed in the non-active area on the encapsulation portion and electrically coupled to the plurality of touch electrodes;
   a shielding electrode located under the encapsulation portion in the non-active area, with at least a part thereof located on the plurality of signal lines, and electrically coupled to a common electrode of the plurality of light emitting elements; and
   a common voltage supply line located under the shielding electrode and electrically coupled to the shielding electrode,
   wherein at least one of the shielding electrode or the common voltage supply line is disposed in an area including an area in which the plurality of touch routing lines overlap with the plurality of signal lines in the non-active area.

2. The touch display device according to claim 1, wherein the plurality of signal lines are located between the active area and the common voltage supply line.

3. The touch display device according to claim 1, wherein at least one of the plurality of signal lines is disposed in an area overlapping with the common voltage supply line.

4. The touch display device according to claim 3, wherein a width of the common voltage supply line is larger than a width of the at least one of the plurality of signal lines overlapping with the common voltage supply line.

5. The touch display device according to claim 1, wherein the shielding electrode includes:
   a first part located on the plurality of signal lines; and
   a second part connected to the first part and located on one side of at least one of the plurality of signal lines.

6. The touch display device according to claim 1, wherein the shielding electrode is formed of a same material as pixel electrodes of the plurality of light emitting elements.

7. The touch display device according to claim 1, wherein the common voltage supply line is disposed in a same layer as one of the plurality of signal lines.

8. The touch display device according to claim 7, wherein the common voltage supply line is disposed in a same layer as a signal line from the plurality of signal lines at a lowest position among the plurality of signal lines.

9. The touch display device according to claim 1, wherein a part of the plurality of signal lines, disposed in an area other than an area overlapping with the shielding electrode and the common voltage supply line, is disposed in an area other than an area overlapping with the plurality of touch routing lines.

10. The touch display device according to claim 1, wherein at least a part of the encapsulation portion, disposed in the non-active area, includes an inclined surface, and a part of the plurality of touch routing lines are disposed on the inclined surface.

11. The touch display device according to claim 1, wherein a top surface of the encapsulation portion overlapping with the shielding electrode in the non-active area is flat.

* * * * *